(12) United States Patent
Kim

(10) Patent No.: US 12,538,472 B2
(45) Date of Patent: Jan. 27, 2026

(54) SEMICONDUCTOR DEVICE

(71) Applicant: Samsung Electronics Co., Ltd., Suwon-si (KR)

(72) Inventor: Kijoon Kim, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 512 days.

(21) Appl. No.: 18/174,028

(22) Filed: Feb. 24, 2023

(65) Prior Publication Data

US 2023/0292492 A1  Sep. 14, 2023

(30) Foreign Application Priority Data

Mar. 14, 2022 (KR) ..................... 10-2022-0031651

(51) Int. Cl.
  *H10B 12/00*  (2023.01)
(52) U.S. Cl.
  CPC .......... *H10B 12/315* (2023.02); *H10B 12/05* (2023.02); *H10B 12/482* (2023.02)
(58) Field of Classification Search
  CPC .............. H10D 30/6735; H10B 12/315; H10B 12/482; H10B 12/488
  See application file for complete search history.

(56) References Cited

U.S. PATENT DOCUMENTS

| | | | |
|---|---|---|---|
| 8,373,237 B2 | 2/2013 | Park et al. | |
| 8,884,340 B2 | 11/2014 | Kim et al. | |
| 9,177,872 B2 | 11/2015 | Sandhu | |
| 9,385,164 B2 | 7/2016 | Xie et al. | |
| 9,691,905 B2 | 6/2017 | Ito et al. | |
| 10,347,637 B2 | 7/2019 | Sandhu | |
| 11,107,819 B2 | 8/2021 | Sandhu | |
| 2007/0218646 A1 | 9/2007 | Hitosugi et al. | |

(Continued)

FOREIGN PATENT DOCUMENTS

| KR | 10-2011-0052208 A | 5/2011 |
|---|---|---|
| KR | 10-2012-0132998 A | 12/2012 |

(Continued)

OTHER PUBLICATIONS

Office Action in Taiwanese Appln. No. 112109139, mailed on Jun. 2, 2025, 23 pages (with Machine Translation).

(Continued)

*Primary Examiner* — Steven M Page
(74) *Attorney, Agent, or Firm* — Fish & Richardson P.C.

(57) ABSTRACT

A semiconductor device includes: a bit line; an active semiconductor layer on the bit line, having a first portion extending in a vertical direction and a second portion connected to the first portion and extending in a horizontal direction, including an oxide semiconductor; a word line on a side wall of the active semiconductor layer; a gate insulating layer between the active semiconductor layer and the word line; a first contact on the active semiconductor layer, having a bottom at a level lower than a top surface of the word line and a top at a level higher than the top surface of the word line, including an oxide semiconductor containing a first dopant; a second contact adjacent to the second portion of the active semiconductor layer on the bit line and including an oxide semiconductor containing a second dopant; and a landing pad on the first contact.

20 Claims, 29 Drawing Sheets

(56) References Cited

U.S. PATENT DOCUMENTS

| | | | |
|---|---|---|---|
| 2013/0292675 A1 | 11/2013 | Tsubuku et al. | |
| 2019/0296155 A1* | 9/2019 | Sawabe | H10B 12/31 |
| 2020/0111800 A1* | 4/2020 | Ramaswamy | H10B 12/033 |
| 2020/0111908 A1 | 4/2020 | Sills et al. | |
| 2020/0111917 A1 | 4/2020 | Ramaswamy et al. | |
| 2020/0411686 A1 | 12/2020 | Haratipour et al. | |
| 2022/0028903 A1 | 1/2022 | Lee et al. | |
| 2023/0187548 A1* | 6/2023 | Lee | H10D 30/63 |
| | | | 257/329 |

FOREIGN PATENT DOCUMENTS

| | | |
|---|---|---|
| KR | 101547326 B1 | 8/2015 |
| KR | 10-2020-0143113 A | 12/2020 |
| KR | 10-2021-0054019 A | 5/2021 |
| KR | 10-2021-0103585 A | 8/2021 |
| TW | 201501245 A | 1/2015 |

OTHER PUBLICATIONS

H. Hosono, Journal of Non-Crystalline Solids 352 (2006) 851-858.
Iwasaki et al., Appl. Phys. Lett. 90, 242114 (2007).
ACS Appl. Mater. Interfaces 2018, 10, 7223-7230.
Taiwanese Office Action dated Aug. 21, 2024 (corresponding to TW 112109139).
Office Action in Korean Appln. No. 10-2022-0031651, mailed on Sep. 30, 2025, 12 pages (with English translation).

\* cited by examiner

SEMICONDUCTOR DEVICE

CROSS-REFERENCE TO RELATED APPLICATION

This application is based on and claims priority under 35 U.S.C. § 119 to Korean Patent Application No. 10-2022-0031651, filed on Mar. 14, 2022, in the Korean Intellectual Property Office, the disclosure of which is incorporated by reference herein in its entirety.

BACKGROUND

The inventive concepts relate to a semiconductor device, and more particularly, to a semiconductor device including a capacitor structure.

According to the down-scaling of semiconductor devices, the size of dynamic random access memory (DRAM) devices has also been reduced. In a DRAM device having a 1T-1C structure in which one transistor is connected to one capacitor, the miniaturization of the DRAM device has increased the issue of leakage current through a channel area. To reduce leakage current, a transistor using an oxide semiconductor material as a channel layer has been suggested.

SUMMARY

Some example embodiments provide a semiconductor device capable of decreasing a leakage current while having a reduced contact resistance.

Some example embodiments provide a method of manufacturing a semiconductor device in which a leakage current decreases while a contact resistance is reduced.

According to an example embodiment, there is provided a semiconductor device including: a bit line extending on a substrate in a first horizontal direction; an active semiconductor layer on the bit line, the active semiconductor layer having a first portion extending in a vertical direction perpendicular to a top surface of the substrate and a second portion connected to a bottom portion of the first portion and extending in the first horizontal direction, and the active semiconductor layer including an oxide semiconductor material; a word line on a first side wall of the active semiconductor layer and extending in a second horizontal direction perpendicular to the first horizontal direction; a gate insulating layer between the active semiconductor layer and the word line; a first contact on the active semiconductor layer, the first contact having a bottom surface at a level lower than a top surface of the word line and a top surface at a level higher than the top surface of the word line, and the first contact including an oxide semiconductor containing a first dopant; a second contact adjacent to the second portion of the active semiconductor layer on the bit line and including an oxide semiconductor containing a second dopant; and a landing pad on the first contact.

According to an example embodiment, there is provided a semiconductor device including: a bit line extending on a substrate in a first horizontal direction; a mold insulating layer covering the bit line on the substrate and including a mold opening; a first cell transistor on a first side wall of the mold opening; and a second cell transistor on a second side wall of the mold opening, wherein each of the first cell transistor and the second cell transistor comprises: an active semiconductor layer having a first portion on the bit line and extending in a vertical direction perpendicular to a top surface of the substrate and a second portion connected to a bottom portion of the first portion and extending in the first horizontal direction, and the active semiconductor layer including an oxide semiconductor material; a word line on a first side wall of the active semiconductor layer and extending in a second horizontal direction perpendicular to the first horizontal direction; a gate insulating layer between the active semiconductor layer and the word line; a first contact on the active semiconductor layer and having a bottom surface at a level lower than a top surface of the word line and the first contact having a top surface at a level higher than the top surface of the word line; and a landing pad on the first contact.

According to another aspect of an embodiment, there is provided a semiconductor device including: a bit line extending on a substrate in a first horizontal direction; a mold insulating layer on the bit line and having a mold opening; an active semiconductor layer on an inner wall of the mold opening, the active semiconductor layer having a first portion extending in a vertical direction perpendicular to a top surface of the substrate and a second portion connected to a bottom portion of the first portion and extending in the first horizontal direction, and the active semiconductor layer including an oxide semiconductor material; a word line inside the mold opening and on a first side wall of the active semiconductor layer and extending in a second horizontal direction perpendicular to the first horizontal direction; a gate insulating layer between the active semiconductor layer and the word line; a first contact on the active semiconductor layer, the first contact having a bottom surface at a level lower than a top surface of the word line and a top surface at a level higher than the top surface of the word line, and the first contact including an oxide semiconductor containing a first dopant; a second contact adjacent to the second portion of the active semiconductor layer on the bit line and including an oxide semiconductor containing a second dopant; a landing pad on the first contact; and a capacitor structure on the landing pad.

BRIEF DESCRIPTION OF THE DRAWINGS

Embodiments of the inventive concepts will be more clearly understood from the following detailed description taken in conjunction with the accompanying drawings in which:

FIGS. 11 to 23 are cross-sectional views illustrating a method of manufacturing a semiconductor device, according to some example embodiments; FIGS. 11 to 14, 15A, 16A, and 17 to 23 are cross-sectional views taken along the line A1-A1' of FIG. 2, and FIGS. 15B and 16B are cross-sectional views taken along the line A2-A2' of FIG. 2;

DETAILED DESCRIPTION OF THE EMBODIMENTS

Figure 1:
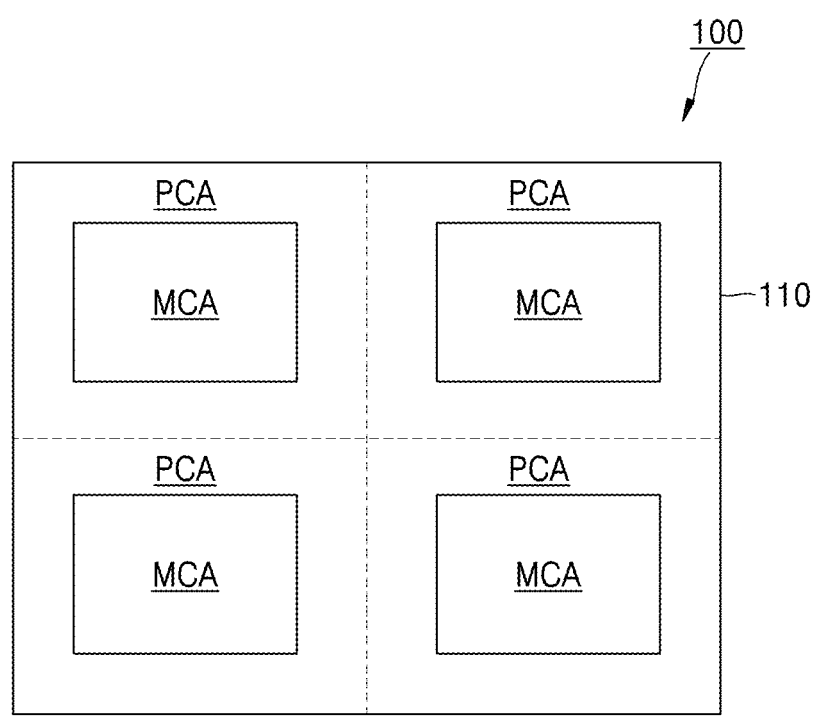
FIG. 1 is a layout diagram of a semiconductor device according to some example embodiments.
Figure 2:
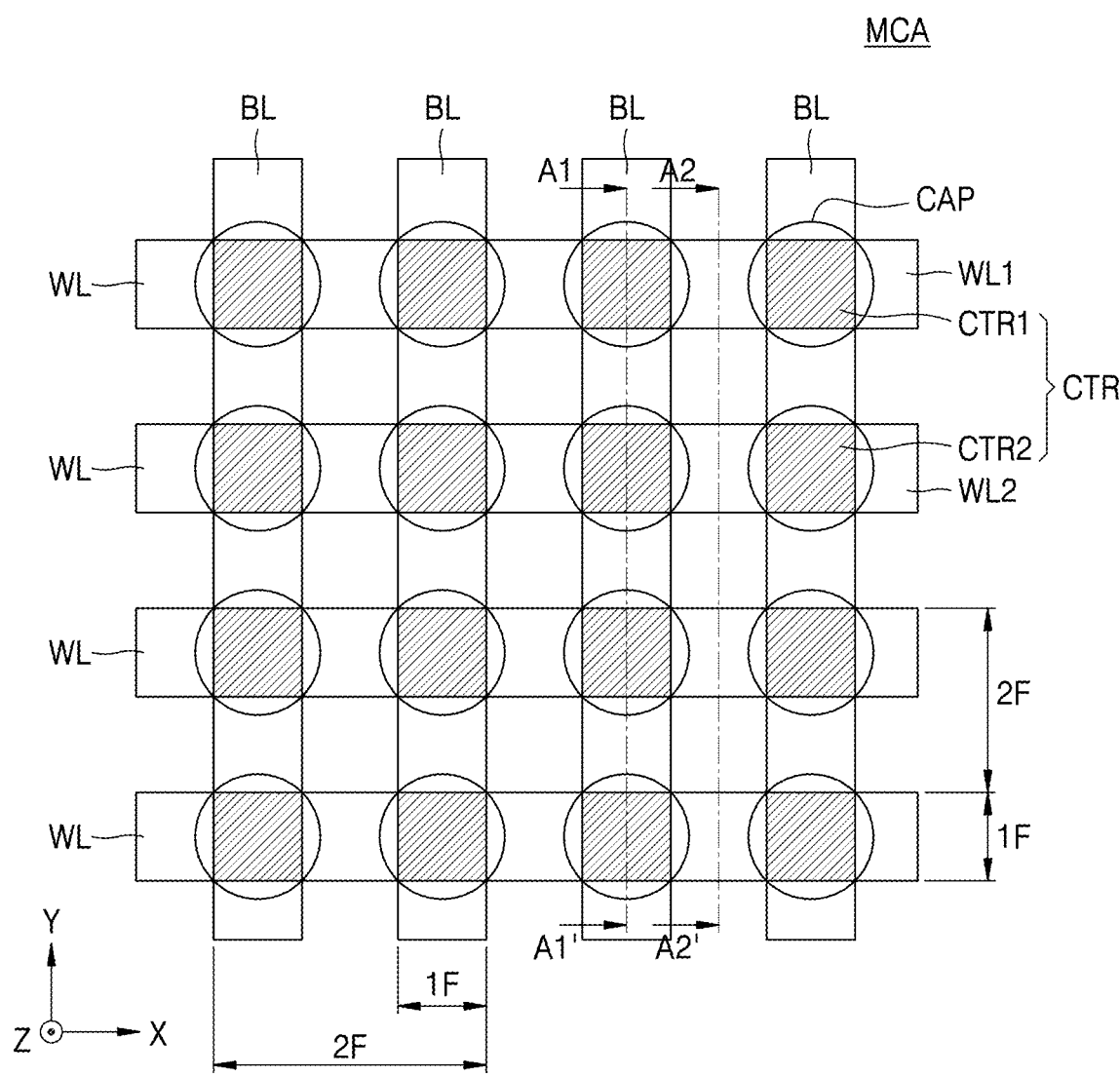
FIG. 2 is an enlarged layout diagram of a cell array area of FIG. 1.
Figure 3:
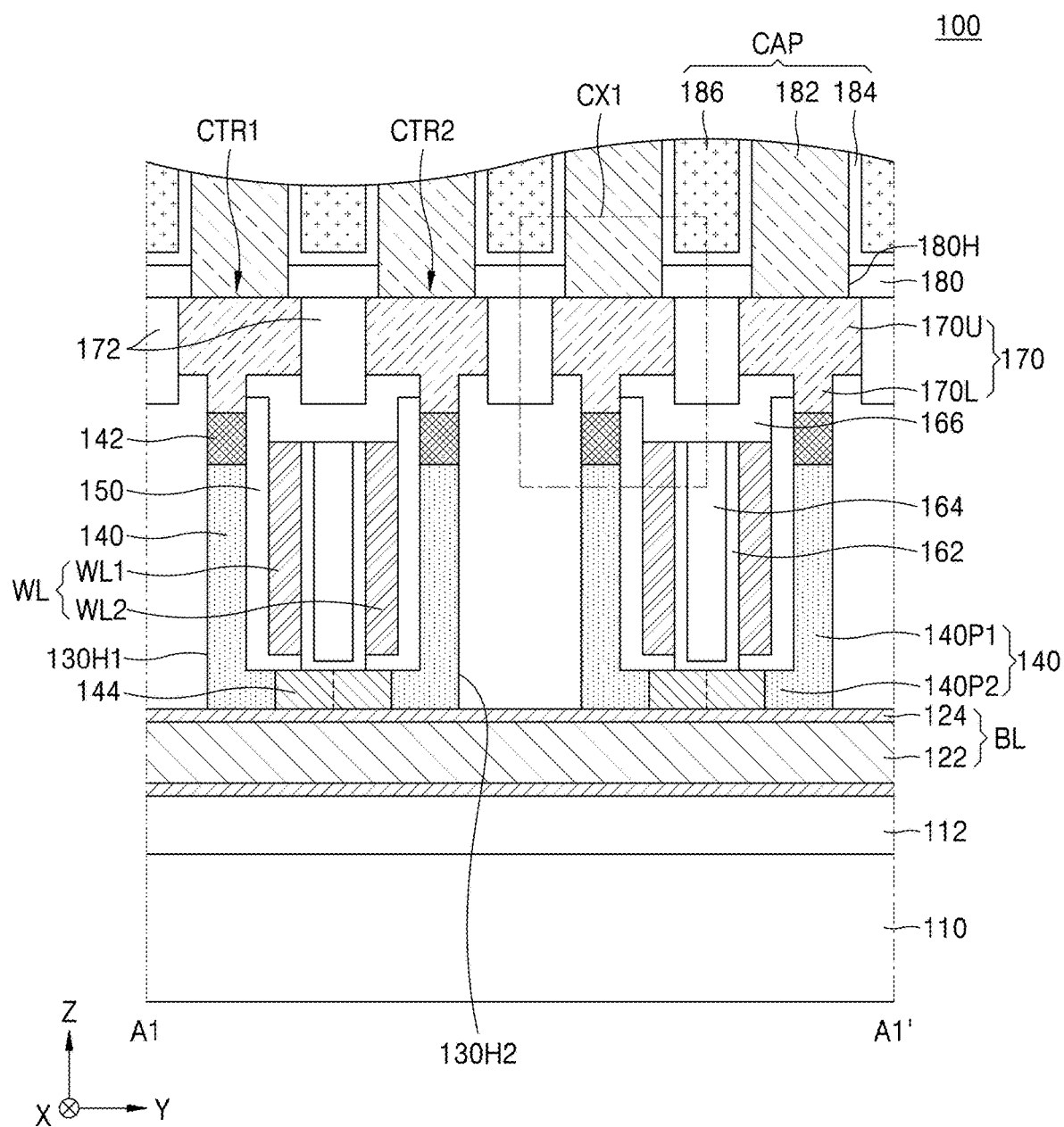
FIG. 3 is a cross-sectional view taken along the line A1-A1' of FIG. 2.
Figure 4:
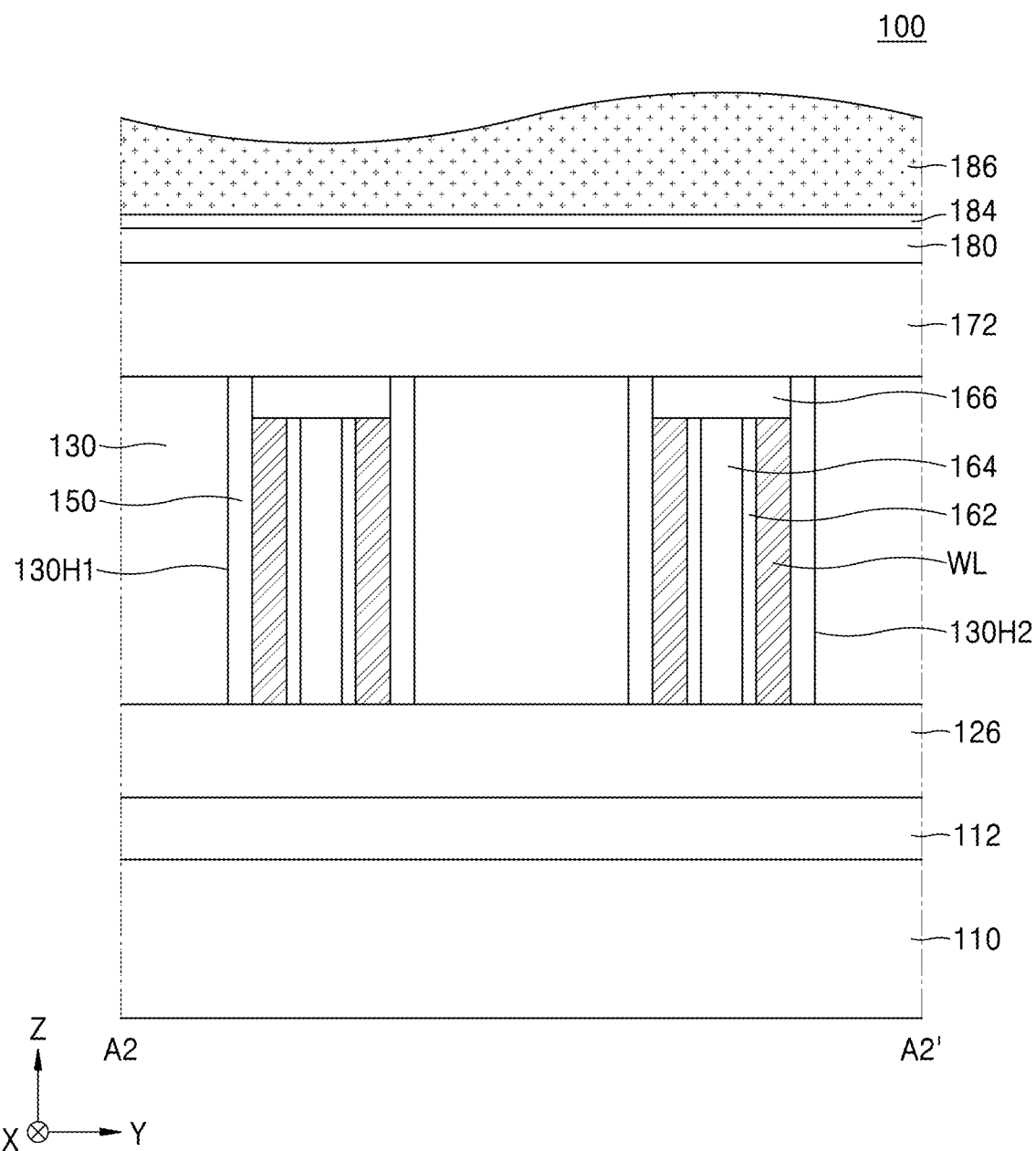
FIG. 4 is a cross-sectional view taken along the line A2-A2' of FIG. 2.
Figure 5:
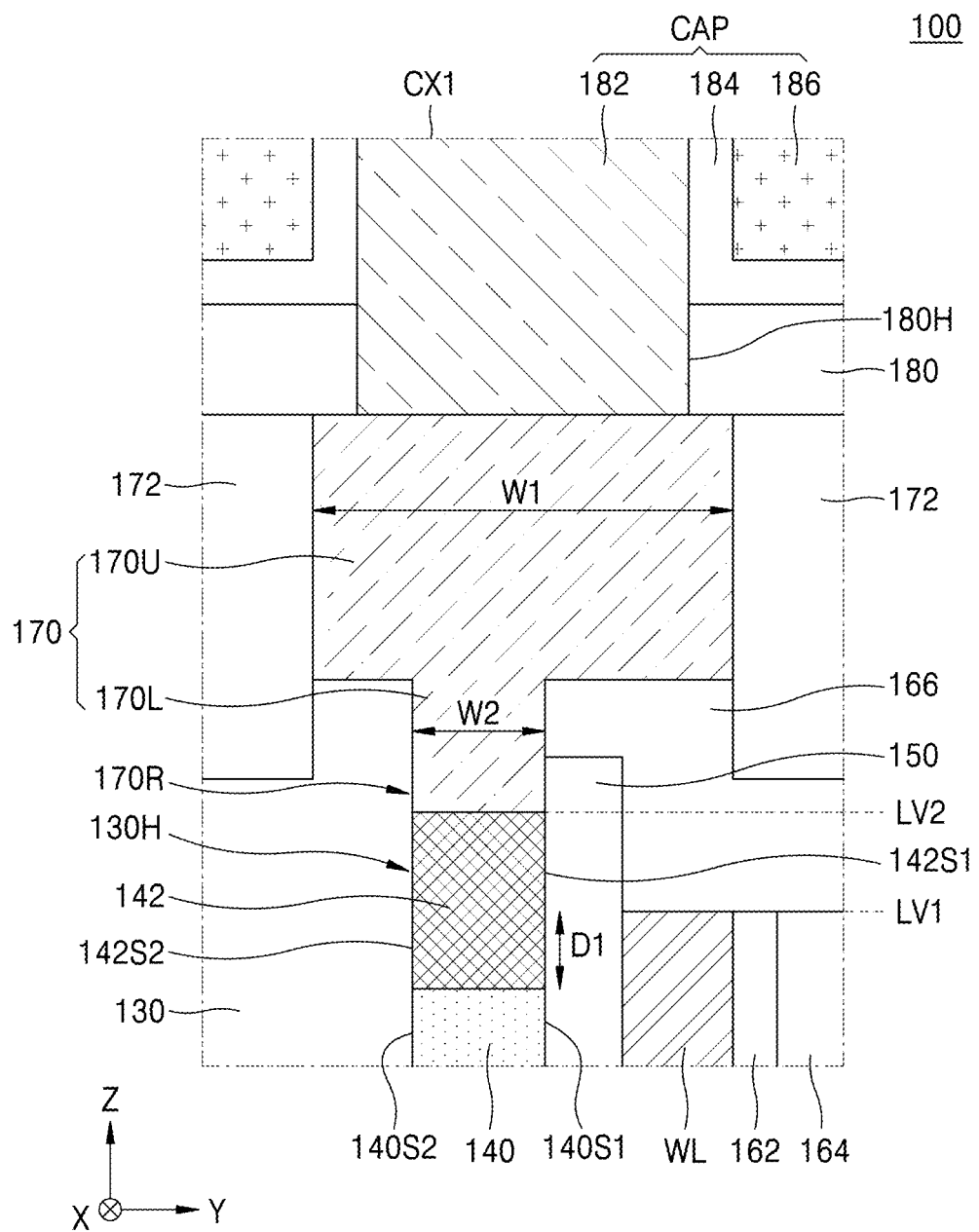
FIG. 5 is an enlarged cross-sectional view of the CX1 region of FIG. 3.

FIG. 1 is a layout diagram of a semiconductor device 100 according to some example embodiments. FIG. 2 is an enlarged layout diagram of a cell array area MCA of FIG. 1. FIG. 3 is a cross-sectional view taken along the line A1-A1' of FIG. 2. FIG. 4 is a cross-sectional view taken along the line A2-A2' of FIG. 2. FIG. 5 is an enlarged view of the CX1 region of FIG. 3.

With reference to FIGS. 1 to 5, the semiconductor device 100 may include a substrate 110 including the cell array area MCA and a peripheral circuit area PCA. In some embodiments, the cell array area MCA may be a memory cell area of a dynamic random access memory (DRAM) device, and the peripheral circuit area PCA may be a core area or a peripheral circuit area of the DRAM device. For example, the peripheral circuit area PCA may include a peripheral circuit transistor (not shown) for transmitting a signal and/or power to a memory cell array included in the cell array area MCA. In some example embodiments, the peripheral circuit transistor (not shown) may constitute various circuits, such as a command decoder, a control logic, an address buffer, a row decoder, a column decoder, a sense amplifier, a data input/output circuit, etc.

As illustrated in FIG. 2, a plurality of word lines WL extending in a first horizontal direction (X direction) and a plurality of bit lines BL extending in a second horizontal direction (Y direction) may be arranged in the cell array area MCA. A plurality of cell transistors CTR may be arranged at intersections of the plurality of word lines WL and the plurality of bit lines BL. A plurality of capacitor structures CAP may be respectively arranged on the plurality of cell transistors CTR.

The plurality of word lines WL may include a first word line WL1 and a second word line WL2 alternately arranged in the second horizontal direction (Y direction), and the plurality of cell transistors CTR may include a first cell transistor CTR1 and a second cell transistor CTR2 alternately arranged in the second horizontal direction (Y direction). The first cell transistor CTR1 may be arranged on the first word line WL1, and the second cell transistor CTR2 may be arranged on the second word line WL2.

The first cell transistor CTR1 and the second cell transistor CTR2 may be mirror-symmetrical with each other. For example, the first cell transistor CTR1 and the second cell transistor CTR2 may be mirror-symmetrical with each other with respect to a center line extending in the first horizontal direction (X direction) between the first cell transistor CTR1 and the second cell transistor CTR2.

In some example embodiments, the width of the plurality of word lines WL may be 1F, the pitch (i.e., a sum of the width and an interval) of the plurality of word lines WL may be 2F, the width of the plurality of bit lines BL may be 1F, the pitch (i.e., a sum of the width and an interval) of the plurality of bit lines BL may be 2F, and a unit area for forming one cell transistor CTR may be 4F2 Accordingly, as the cell transistors CTR may be of a cross-point type, which requires a relatively small unit area, this may be an advantage in enhancing the integration of the semiconductor device 100.

As illustrated in FIG. 3, a lower insulating layer 112 may be arranged on the substrate 110. The substrate 110 may include silicon, for example, single crystalline silicon, polycrystalline silicon, or amorphous silicon. In other embodiments, the substrate 110 may include at least one selected from Ge, SiGe, SiC, GaAs, InAs, and InP. In some embodiments, the substrate 110 may include a conductive area, for example, a well doped with impurities or a structure doped with impurities. The lower insulating layer 112 may include an oxide film, a nitride film, or a combination thereof.

The bit line BL extending in the second horizontal direction (Y direction) may be arranged on the lower insulating layer 112. In some example embodiments, the bit line BL may include Ti, TiN, Ta, TaN, Mo, Ru, W, WN, TiSiN, WSiN, polysilicon, or a combination thereof. For example, the bit line BL may include a conductive layer 122 and a conductive barrier layer 124 arranged on the top surface and the bottom surface of the conductive layer 122. A bit line insulating layer 126 extending in the second horizontal direction (Y direction) may be arranged on a side wall of the bit line BL. For example, the bit line insulating layer 126 may fill a space between two adjacent bit lines BL and have the same height as the bit lines BL.

A mold insulating layer 130 may be arranged on the bit line BL and the bit line insulating layer 126. The mold insulating layer 130 may include a plurality of mold openings 130H. The plurality of mold openings 130H may include a first side wall 130H1 and a second side wall 130H2, and the first side wall 130H1 and the second side wall 130H2 may be arranged apart from each other and extend in the first horizontal direction (X direction). The top surface of the bit line BL may be exposed at a bottom portion of each of the plurality of mold openings 130H. The mold insulating layer 130 may include at least one of silicon oxide, silicon nitride, and silicon oxynitride.

A plurality of active semiconductor layers 140 may be arranged on the inner wall of the plurality of mold openings 130H. The active semiconductor layer 140 of the first cell transistor CTR1 may be arranged on the first side wall 130H1 and the bottom portion of the plurality of mold openings 130H, and the active semiconductor layer 140 of the second cell transistor CTR2 may be arranged on the second side wall 130H2 and the bottom portion of the plurality of mold openings 130H. The active semiconductor layer 140 of the first cell transistor CTR1 and the active semiconductor layer 140 of the second cell transistor CTR2 may be mirror-symmetrical with each other.

Each of the plurality of active semiconductor layers 140 may include a first portion 140P1 and a second portion 140P2. For example, the first portion 140P1 of the active semiconductor layer 140 of the first cell transistor CTR1 may extend on the first side wall 130H1 of the plurality of mold openings 130H in the vertical direction, and the second portion 140P2 may be connected to a bottom portion of the first portion 140P1 and extend in the second horizontal direction (Y direction). The second portion 140P2 may be arranged on the bit line BL. For example, each of the plurality of active semiconductor layers 140 may have a vertical cross-section in an L shape.

The first portion 140P1 of the plurality of active semiconductor layers 140 may include a first side wall 140S1 and a second side wall 140S2 opposite to the first side wall 140S1, and the second side wall 140S2 may be in contact with the mold insulating layer 130. Each of the plurality of active semiconductor layers 140 may have a top surface arranged at a level lower than the top surface of the mold insulating layer 130.

In some example embodiments, the plurality of active semiconductor layers 140 may include an oxide semiconductor material. For example, the plurality of active semiconductor layers 140 may include at least one of IGZO (InGaZnO$_x$), IWO (InWO$_x$), ITGO (InSnGaO$_x$), IAZO (InAlZnO$_x$), IGO (InGaO$_x$), and ITZO (InSnZnO$_x$).

A gate insulating layer 150 may be arranged on the first side wall 140S1 of the plurality of active semiconductor layers 140, and the word line WL may be arranged on the gate insulating layer 150. For example, the gate insulating layer 150 may be arranged conformally on the first side wall 140S1 of the first portion 140P1 of the plurality of active semiconductor layers 140 and on the top surface of the second portion 140P2 of the plurality of active semiconductor layers 140. The word line WL may be arranged on the first side wall 140S1 of the first portion 140P1 of the plurality of active semiconductor layers 140 and on the top surface of the second portion 140P2 of the plurality of active semiconductor layers 140.

In some example embodiments, the gate insulating layer 150 may be arranged to cover all of the active semiconductor layer 140 of the first cell transistor CTR1 arranged on the first side wall 130H1 of the mold opening 130H and the active semiconductor layer 140 of the second cell transistor CTR2 arranged on the second side wall 130H2 of the mold opening 130H. That is, a part of the gate insulating layer 150 arranged on the active semiconductor layer 140 of the first cell transistor CTR1 may be integrally connected to a part of the gate insulating layer 150 arranged on the active semiconductor layer 140 of the second cell transistor CTR2. Moreover, the word line WL of the first cell transistor CTR1 may be arranged apart from the word line WL of the second cell transistor CTR2 in one mold opening 130H.

In some example embodiments, the gate insulating layer 150 may include at least one selected from a high-k dielectric material having a higher dielectric constant than a silicon oxide and a ferroelectric material. In some embodiments, the gate insulating layer 150 may include at least one material selected from hafnium oxide (HfO), hafnium silicate (HfSiO), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), lead zirconium titanate (PZT), bismuth ferrite oxide (BFO), strontium titanium oxide (SrTiO), yttrium oxide (YO), aluminum oxide (AlO), and lead scandium tantalum oxide (PbScTaO).

In some example embodiments, the word line WL may include Ti, TiN, Ta, TaN, Mo, Ru, W, WN, TiSiN, WSiN, polysilicon, or a combination thereof.

A first contact 142 may be arranged on the top surface of the plurality of active semiconductor layers 140. The first contact 142 may include an oxide semiconductor containing a first dopant. The oxide semiconductor material may include at least one of IGZO (InGaZnO$_x$), IWO (InWO$_x$), ITGO (InSnGaO$_x$), IAZO (InAlZnO$_x$), IGO (InGaO$_x$), and ITZO (InSnZnO$_x$). The first dopant may include at least one of indium, tin, bismuth, and tungsten. The first contact 142 may have a resistivity lower than that of the plurality of active semiconductor layers 140 or have a higher carrier mobility than that of the plurality of active semiconductor layers 140.

In some example embodiments, the first contact 142 may include a bottom surface at a level lower than a top surface of the word line WL and a top surface arranged at a level higher than the top surface of the word line WL. For example, as illustrated in FIG. 5, the top surface of the word line WL may be at a first vertical level LV1, and the top surface of the first contact 142 may be arranged at a second vertical level LV2. For example, both side walls of the first contact 142 may be aligned with the first side wall 140S1 and the second side wall 140S2 of the first portion 140P1 of the active semiconductor layer 140.

In some example embodiments, the first contact 142 may be formed by a method of ion-implanting the first dopant into an upper portion of a preliminary active semiconductor layer 140P (see FIG. 14), etc. For example, the first contact 142 may be formed by ion-implanting the first dopant in an area having a certain depth from the top surface of a part of the preliminary active semiconductor layer 140P arranged on the first side wall 130H1 and the second side wall 130H2 of the mold opening 130H. The first dopant may facilitate movement of an electron carrier in an oxide semiconductor, and accordingly, the contact resistance between the active semiconductor layer 140 and a landing pad 170 formed on the first contact 142 may be reduced.

In some example embodiments, the first dopant may be implanted into the inside of the preliminary active semiconductor layer 140P from a surface of the preliminary active semiconductor layer 140P in a target depth range by using an ion having relatively high ion energy, and accordingly, the content of the first dopant in the first contact 142 may be formed to have a Gaussian distribution in a vertical direction (Z direction). The content of the first dopant may be measured by analysis equipment capable of analyzing an element content, such as an energy dispersive X-ray spectroscopy (EDX), a secondary ion mass spectroscopy (SIMS), an atomic probe tomography (APT), etc.

For example, the first contact 142 may include a first side wall 142S1 and a second side wall 142S2, and the first side wall 142S1 may be covered by the gate insulating layer 150, and the second side wall 142S2 may be covered by the mold insulating layer 130. Moreover, the first side wall 142S1 of the first contact 142 may be aligned with the first side wall 140S1 of the first portion 140P1 of the active semiconductor layer 140, and the second side wall 142S2 of the first contact 142 may be aligned with the second side wall 140S2 of the first portion 140P1 of the active semiconductor layer 140.

In some example embodiments, the first contact 142 may have a height of above 5 nm to about 20 nm in the vertical direction (Z direction). Furthermore, the bottom surface of the first contact 142 may be spaced apart from the top surface of the word line WL by a first distance D1 in the vertical direction (Z direction). The first distance D1 may be about 2 nm to about 10 nm.

A second contact 144 may be arranged on one side of the second portion 140P2 of the active semiconductor layer 140 in the mold opening 130H. The second contact 144 may include an oxide semiconductor containing a second dopant. The oxide semiconductor material may include at least one of IGZO (InGaZnO$_x$), IWO (InWO$_x$), ITGO (InSnGaO$_x$), IAZO (InAlZnO$_x$), IGO (InGaO$_x$), and ITZO (InSnZnO$_x$) The second dopant may include at least one of indium, tin, bismuth, and tungsten. The second contact 144 may have a resistivity lower than that of the plurality of active semiconductor layers 140 or have a higher carrier mobility.

In some example embodiments, the second contact 144 may be arranged on the bit line BL at a bottom portion of the mold opening 130H. The top surface of the second contact 144 may be arranged on the same plane as the top surface of the second portion 140P2 of the active semiconductor layer 140, and a part of the top surface of the second contact 144 may be covered by the gate insulating layer 150. The second contact 144 arranged on one side of the active semiconductor layer 140 of the first cell transistor CTR1 arranged on the first side wall 130H1 of the mold opening 130H may be connected to the second contact 144 arranged on one side of the active semiconductor layer 140 of the second cell transistor CTR2 arranged on the second side wall 130H2 of the mold opening 130H. In FIG. 3, a boundary between the second contact 144 of the first cell transistor CTR1 and the second contact 144 of the second cell transistor CTR2 is shown as a dashed line for convenience in explanation.

In some example embodiments, the second contact 144 may be formed by a method of ion-implanting the second dopant into an upper portion of a preliminary active semiconductor layer 140P, etc. For example, the second contact 144 may be formed by ion-implanting the second dopant into an area having a certain depth from the top surface of a part of the preliminary active semiconductor layer 140P arranged on the surface of the bottom portion of the mold opening 130H. The second dopant may facilitate movement of an electron carrier in an oxide semiconductor, and accordingly, the contact resistance between the active semiconductor layer 140 and the bit line BL may be reduced.

In some example embodiments, the process of implanting the second dopant into the second contact 144 may be performed at the same stage as the process of implanting the first dopant into the first contact 142. In such a case, the second dopant may include an element of the same type as that of an element included in the first dopant.

An insulating liner 162 may be arranged on a side wall of two word lines WL spaced apart from each other in the mold opening 130H, and a buried insulating layer 164 filling a space between the two word lines WL spaced apart from each other may be arranged on the insulating liner 162. The insulating liner 162 may be conformally arranged on the side walls of the two word lines WL (i.e., the first word line WL1 and the second word line WL2), which face each other, and on the top surface of the second contact 144, and may have a top surface arranged on the same plane as the word line WL. For example, the insulating liner 162 may include a silicon nitride, and the buried insulating layer 164 may include a silicon oxide.

An upper insulating layer 166 may be arranged on the word line WL and the buried insulating layer 164 in the mold opening 130H. A top surface of the upper insulating layer 166 may be arranged at the same level as a top surface of the mold insulating layer 130.

A landing pad 170 may be arranged on the first contact 142. The landing pad 170 may include an upper portion 170U and a lower portion 170L. The upper portion 170U of the landing pad 170 may refer to a part of the landing pad 170 at a level higher than the top surface of the mold insulating layer 130, and the lower portion 170L of the landing pad 170 may refer to a part of the landing pad 170 arranged inside a landing pad recess 170R defined between the mold insulating layer 130 and the upper insulating layer 166.

In some example embodiments, the upper portion 170U of the landing pad 170 may have a first width W1 in the second horizontal direction (Y direction), and the lower portion 170L of the landing pad 170 may have a second width W2 in the second horizontal direction (Y direction), the second width W2 being less than the first width W1. The lower portion 170L of the landing pad 170 may be arranged inside the landing pad recess 170R, and the upper portion 170U of the landing pad 170 may have a bottom surface arranged on the top surface of the mold insulating layer 130 and the top surface of the upper insulating layer 166 on the lower portion 170L of the landing pad 170. Accordingly, the landing pad 170 may have a T-shaped vertical cross-section. In some example embodiments, the landing pad 170 may include Ti, TiN, Ta, TaN, W, WN, TiSiN, WSiN, polysilicon, or a combination thereof.

The bottom surface of the lower portion 170L of the landing pad 170 may be in contact with the first contact 142, and both side walls of the lower portion 170L of the landing pad 170 may be aligned with both side walls of the first contact 142. The bottom surface of the lower portion 170L of the landing pad 170 may be arranged at a level higher than the top surface of the word line WL, and a part of the side wall of the lower portion 170L of the landing pad 170 may be covered by the gate insulating layer 150.

As illustrated in FIG. 5, the first contact 142 may be arranged between the landing pad 170 and the active semiconductor layer 140, and thus, the landing pad 170 may not be in direct contact with the active semiconductor layer 140. Moreover, as the first contact 142 is arranged between the landing pad 170 and the active semiconductor layer 140, and the bottom surface of the landing pad 170 is arranged at a level higher than the top surface of the word line WL, overlap between the landing pad 170 and the word line WL in the horizontal direction may be prevented. Accordingly, the depth of the landing pad recess 170R may be relatively small, and damage, etc. to the gate insulating layer 150, which may be caused when forming the landing pad recess 170R in a great depth, may be reduced or prevented.

A landing pad insulating layer 172 surrounding a periphery of the landing pad 170 may be arranged on the mold insulating layer 130 and the upper insulating layer 166.

An etch stop layer 180 may be arranged on the landing pad 170 and the landing pad insulating layer 172. The etch stop layer 180 may include an opening 180H, and the top surface of the landing pad 170 may be exposed at a bottom portion of the opening 180H.

The capacitor structures CAP may be arranged on the etch stop layer 180. The capacitor structures CAP may include a lower electrode 182, a capacitor dielectric layer 184, and an upper electrode 186. A side wall of the bottom portion of the lower electrode 182 may be arranged inside an opening 180H of the etch stop layer 180, and the lower electrode 182 may extend in the vertical direction (Z direction). The capacitor dielectric layer 184 may be arranged on the side wall of the lower electrode 182, and the upper electrode 186 may cover the lower electrode 182 on the capacitor dielectric layer 184.

Generally, a cell transistor of a dynamic random access memory (DRAM) device may have a buried channel array transistor (BCAT) structure using a part of a silicon substrate as a channel area. However, according to the improved integration degree of the DRAM device, the size of the cell transistor needs to be reduced as well, and due to this, a leakage current from the channel area of the cell transistor may increase.

According to some example embodiments, when the active semiconductor layer is formed by using an oxide semiconductor material, such as an indium gallium zinc oxide, the leakage current may be reduced remarkably. Moreover, the first contact 142 may be formed by the process of ion-implanting the first dopant between the landing pad 170 and the active semiconductor layer 140, and the first contact 142 may have an increased carrier concentration and a low resistivity.

Furthermore, as the first contact 142 is formed between the landing pad 170 and the active semiconductor layer 140, the depth of the landing pad recess 170R may be relatively small, and overlap between the landing pad 170 and the word line WL in the horizontal direction may be prevented. Accordingly, damage, etc. to the gate insulating layer 150, which may be caused when forming the landing pad recess 170R in a great depth, may be reduced or prevented. Therefore, the semiconductor device 100 may have a reduced leakage current and contact resistance as well as excellent electrical characteristics.

Figure 6:
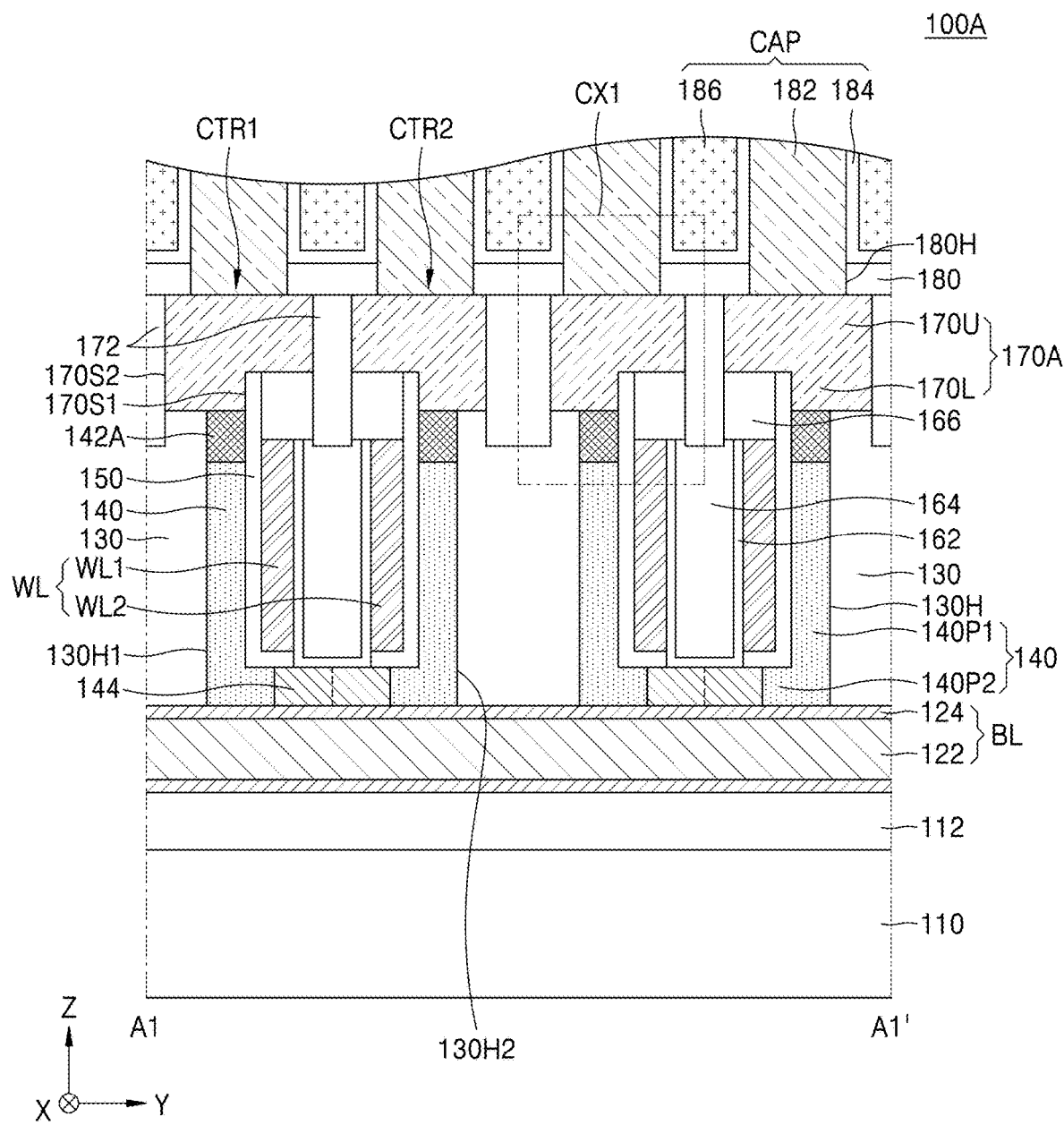
FIG. 6 is a cross-sectional view of a semiconductor device according to some example embodiments.
Figure 7:
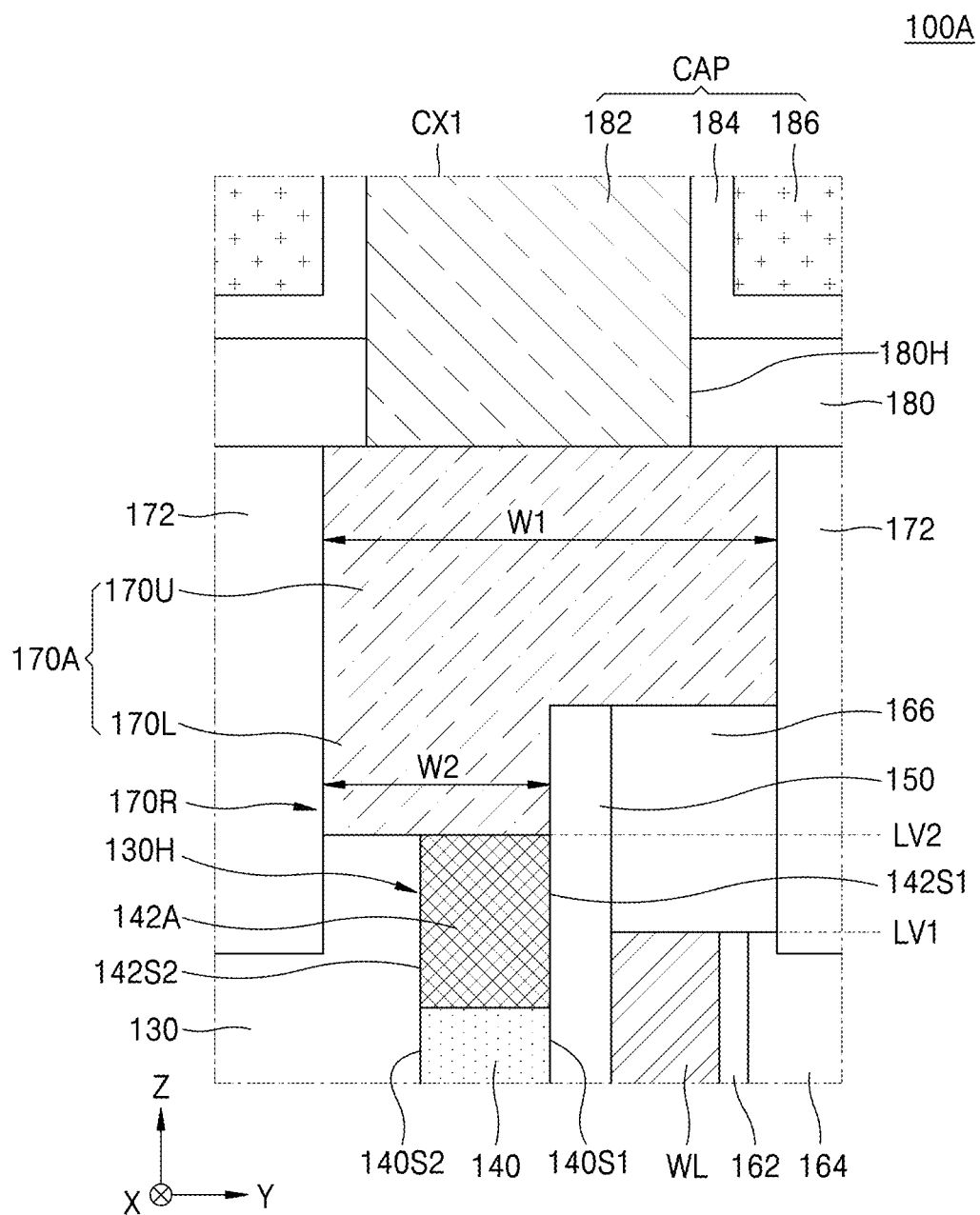
FIG. 7 is an enlarged cross-sectional view of the CX1 region of FIG. 6.

FIG. 6 is a cross-sectional view of a semiconductor device 100A according to some example embodiments, and FIG. 7 is an enlarged view of the CX1 region of FIG. 6. Like reference numerals in FIGS. 1 to 5 denote like elements in FIGS. 6 and 7.

With reference to FIGS. 6 and 7, a landing pad 170A may include the upper portion 170U and the lower portion 170L, and the lower portion 170L may be in contact with the top surface of a first contact 142A. The lower portion 170L may include a first side wall 170S1 in contact with the gate insulating layer 150 and a second side wall 170S2 opposite to the first side wall 170S1. The first side wall 170S1 may be aligned with the first side wall 142S1 of the first contact 142A, and the second side wall 170S2 may protrude outward with respect to the second side wall 142S2 of the first contact 142A.

In some example embodiments, the upper portion 170U of the landing pad 170A may have a first width W1 in the second horizontal direction (Y direction), and the lower portion 170L of the landing pad 170A may have a second width W2 in the second horizontal direction (Y direction), the second width W2 being less than the first width W1. The bottom surface of the lower portion 170L of the landing pad 170A may be arranged to have a flat bottom surface level on the top surface of the mold insulating layer 130 and the top surface of the first contact 142A, the upper portion 170U of the landing pad 170 may have the bottom surface arranged on the gate insulating layer 150 and the upper insulating layer 166, and the landing pad 170A may have an inverted L-shaped vertical cross-section.

According to some example embodiments, before forming the landing pad 170A, an upper portion of the mold insulating layer 130 may be removed by a recess process so that the top surface of the mold insulating layer 130 is arranged at a level lower than the top surface of the gate insulating layer 150. In this manner, the top surface of the first contact 142A may be arranged on the same plane as the top surface of the mold insulating layer 130. Moreover, the bottom surface of the landing pad 170A (for example, in contact with the top surface of the first contact 142A) may be arranged at a vertical level higher than the top surface of the word line WL so that overlap between the landing pad 170A and the word line WL in the horizontal direction may be prevented. Accordingly, damage, etc. to the gate insulating layer 150, which may be caused when forming the landing pad recess 170R in a great depth, may be reduced or prevented. Therefore, the semiconductor device 100A may have a reduced leakage current and contact resistance as well as excellent electrical characteristics.

Figure 8:
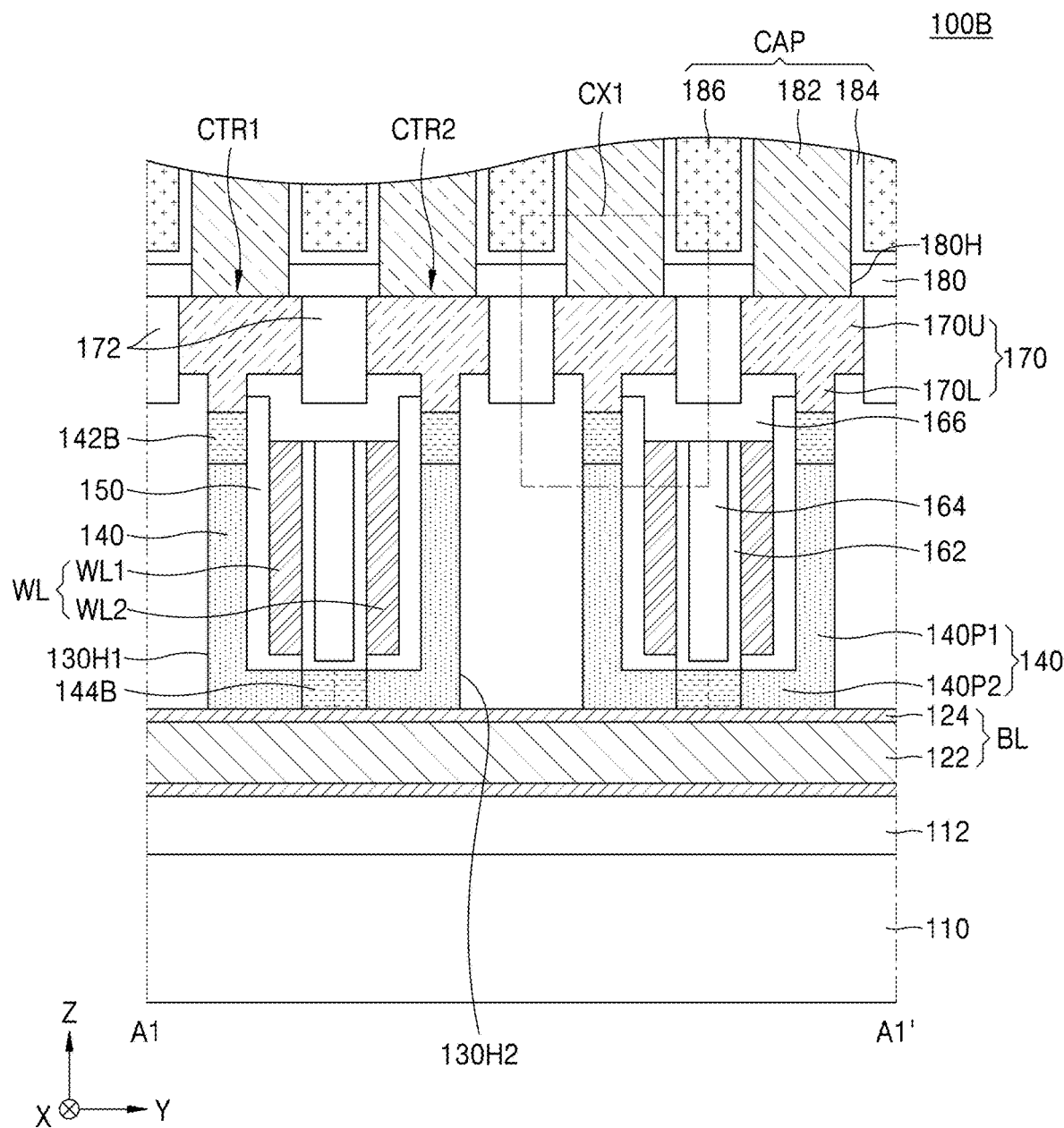
FIG. 8 is a cross-sectional view of a semiconductor device according to some example embodiments.
Figure 9:
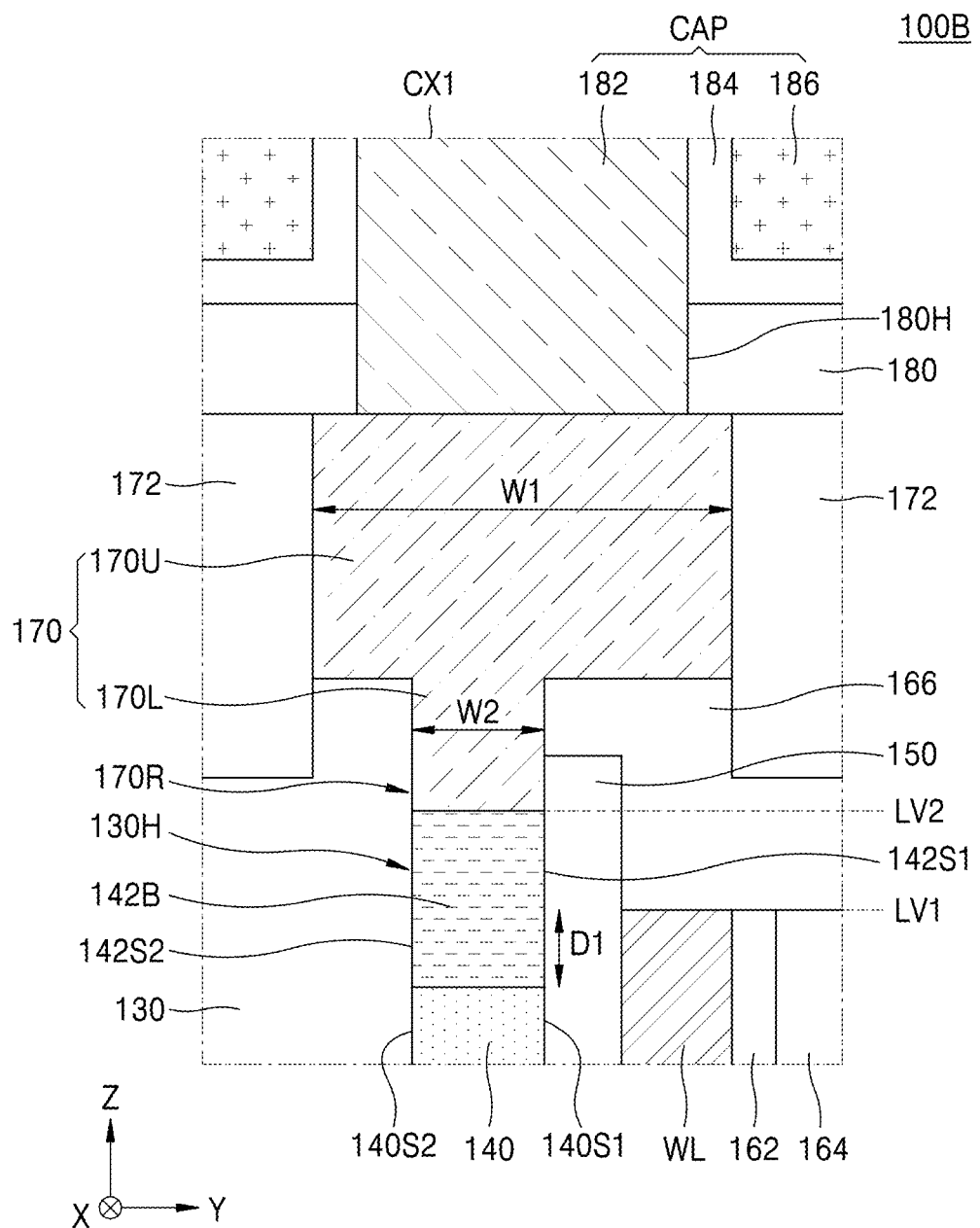
FIG. 9 is an enlarged cross-sectional view of the CX1 region of FIG. 8.

FIG. 8 is a cross-sectional view of a semiconductor device 100B according to some example embodiments, and FIG. 9 is an enlarged view of the CX1 region of FIG. 8. Like reference numerals in FIGS. 1 to 7 denote like elements in FIGS. 8 and 9.

With reference to FIGS. 8 and 9, the active semiconductor layer 140 may include an oxide semiconductor material, and may include at least one of, for example, IGZO ($InGaZnO_x$), IWO ($InWO_x$), ITGO ($InSnGaO_x$), IAZO ($InAlZnO_x$), IGO ($InGaO_x$), and ITZO ($InSnZnO_x$). The active semiconductor layer 140 may have a first oxygen content.

A first contact 142B may include an oxide semiconductor, and may include at least one of, for example, IGZO ($InGaZnO_y$), IWO ($InWO_y$), ITGO ($InSnGaO_y$), IAZO ($InAlZnO_y$), IGO ($InGaO_y$), and ITZO ($InSnZnO_y$). The first contact 142B may have a second oxygen content, and the second oxygen content may be less than the first oxygen content.

A second contact 144B may include an oxide semiconductor, and may include at least one of, for example, IGZO ($InGaZnO_z$), IWO ($InWO_z$), ITGO ($InSnGaO_z$), IAZO ($InAlZnO_z$), IGO ($InGaO_z$), and ITZO ($InSnZnO_z$). The second contact 144B may have a third oxygen content, and the third oxygen content may be less than the first oxygen content.

In some example embodiments, the first contact 142B and the second contact 144B may be formed by performing hydrogen or deuterium plasma treatment on a surface of the preliminary active semiconductor layer 140P, and the first contact 142B and the second contact 144B may include doped hydrogen or deuterium atoms in the oxide semiconductor material after performing the hydrogen or deuterium plasma treatment. Moreover, the first contact 142B and the second contact 144B may further include an oxygen vacancy formed by the hydrogen or deuterium atoms in the oxide semiconductor after performing the hydrogen or deuterium plasma treatment.

In some embodiments, selectively, after performing the hydrogen or deuterium plasma treatment on the surface of the preliminary active semiconductor layer 140P, the first contact 142B and the second contact 144B may expose the surface of the preliminary active semiconductor layer 140P to liquid or gaseous state hydrogen peroxide ($H_2O_2$) or liquid or gaseous state deuterium peroxide ($D_2O_2$) and then perform an ultraviolet irradiation process.

As an oxygen vacancy is formed in the first contact 142B and the second contact 144B, the second oxygen content of the first contact 142B may be less than the first oxygen content of the active semiconductor layer 140, and the third oxygen content of the second contact 144B may be less than the first oxygen content of the active semiconductor layer 140. The oxygen vacancy in the first contact 142B and the second contact 144B may function as a dopant, and according to this, the carrier mobility of the first contact 142B and the second contact 144B may be increased, or the resistivity of the first contact 142B and the second contact 144B may be reduced.

In some example embodiments, a content of the hydrogen or deuterium atoms included in the first contact 142B and the second contact 144B may be measured by analysis equipment capable of analyzing an element content, such as an EDX, an SIMS, an APT, etc. Moreover, the content of oxygen vacancy included in the first contact 142B and the second contact 144B may be measured by analysis equipment capable of analyzing an element content, such as an EDX, an SIMS, an APT, etc.

For example, the process of forming the first contact 142B and the second contact 144B may be performed by forming the word line WL in the mold opening 130H and using the word line WL as a mask, and accordingly, the second contact 144B may be formed not to vertically overlap the word line WL.

Figure 10:
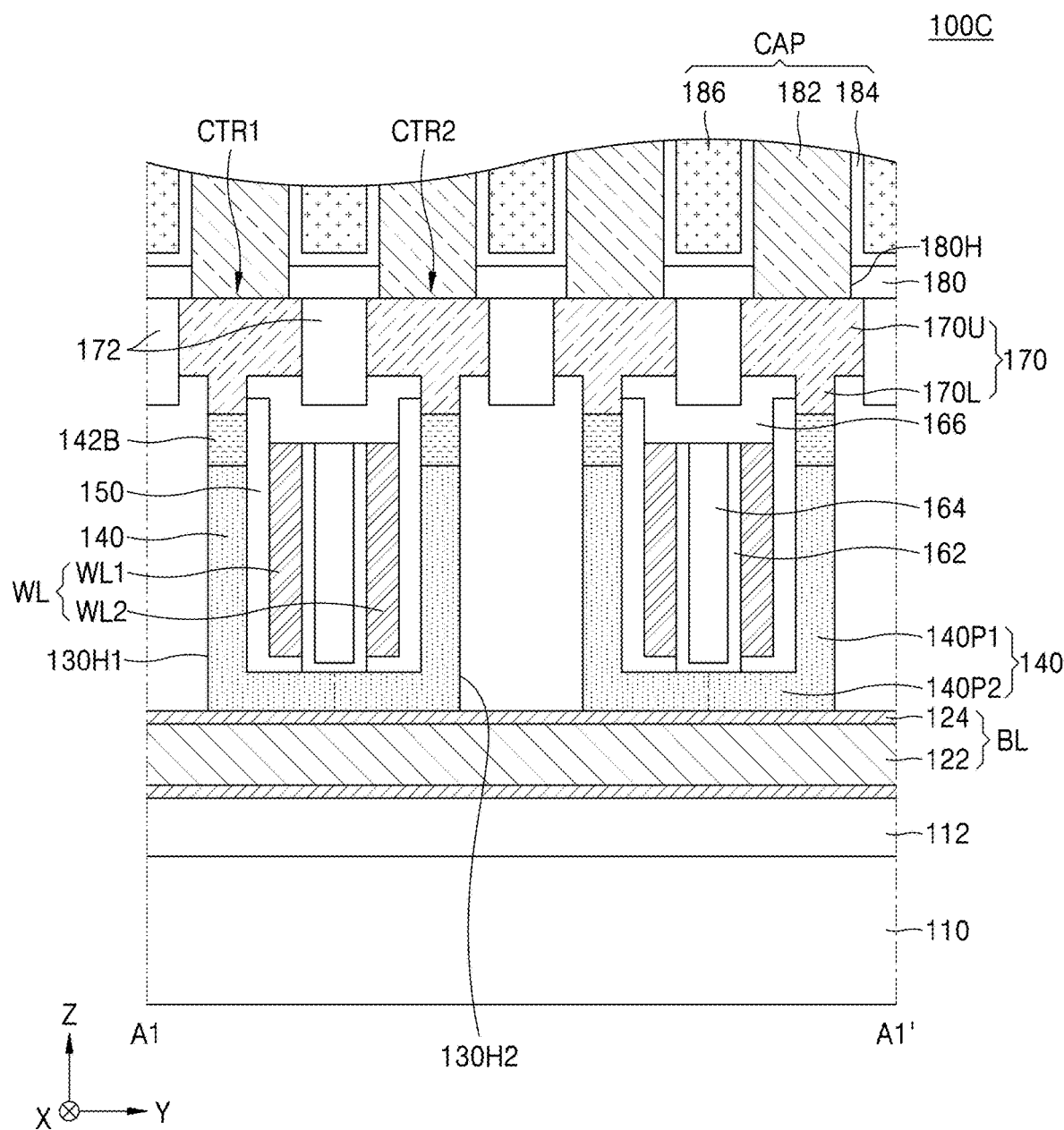
FIG. 10 is a cross-sectional view of a semiconductor device according to some example embodiments.

FIG. 10 is a cross-sectional view of a semiconductor device 100C according to some example embodiments. Like reference numerals in FIGS. 1 to 9 denote like elements in FIG. 10.

With reference to FIG. 10, the first contact 142B may be arranged on the top surface of the active semiconductor layer 140, and the second contact 144B described with reference to FIGS. 8 and 9 may be omitted. Accordingly, in the mold opening 130H, the active semiconductor layer 140 may be arranged on the first side wall 130H1, the second side wall 130H2, and the bottom portion and have a U-shaped vertical cross-section. The active semiconductor layer 140 of the first cell transistor CTR1 may have an L-shaped vertical cross-section, and the active semiconductor layer 140 of the second cell transistor CTR2 may have an L-shaped vertical cross-section, which is mirror-symmetrical with the active semiconductor layer 140 of the first cell transistor CTR1, and may be connected to the active semiconductor layer 140 of the first cell transistor CTR1. In FIG. 10, a boundary between the active semiconductor layer 140 of the first cell transistor CTR1 and the active semiconductor layer 140 of the second cell transistor CTR2 is shown as a dashed line for convenience in explanation.

In some example embodiments, after forming the preliminary active semiconductor layer 140P in the mold opening 130H, a buried layer (not shown) filling the mold opening 130H may be formed on the preliminary active semiconductor layer 140P, and the first contact 142B may be formed by performing the hydrogen or deuterium plasma treatment on the top surface of the preliminary active semiconductor layer 140P, which is not covered by the buried layer. In some example embodiments, the top surface of the preliminary active semiconductor layer 140P, which is not covered by the buried layer, may be exposed to the liquid or gaseous state hydrogen peroxide ($H_2O_2$) or liquid or gaseous state deuterium peroxide ($D_2O_2$), and then the ultraviolet irradiation process may be performed. At this time, a part of the preliminary active semiconductor layer 140P arranged at the bottom portion of the mold opening 130H may be covered by the buried layer and may not be exposed to the plasma treatment or ultraviolet irradiation process, and an oxygen content of the part of the preliminary active semiconductor layer 140P arranged at the bottom portion of the mold opening 130H may not be changed.

FIGS. 11 to 23 are cross-sectional views illustrating a method of manufacturing a semiconductor device, according to some example embodiments. FIGS. 11 to 14, 15A, 16A, and 17 to 23 are cross-sectional views taken along the line A1-A1' of FIG. 2, and FIGS. 15B and 16B are cross-sectional views taken along the line A2-A2' of FIG. 2. Like reference numerals in FIGS. 1 to 10 denote like elements in FIGS. 11 to 23.

Figure 11:
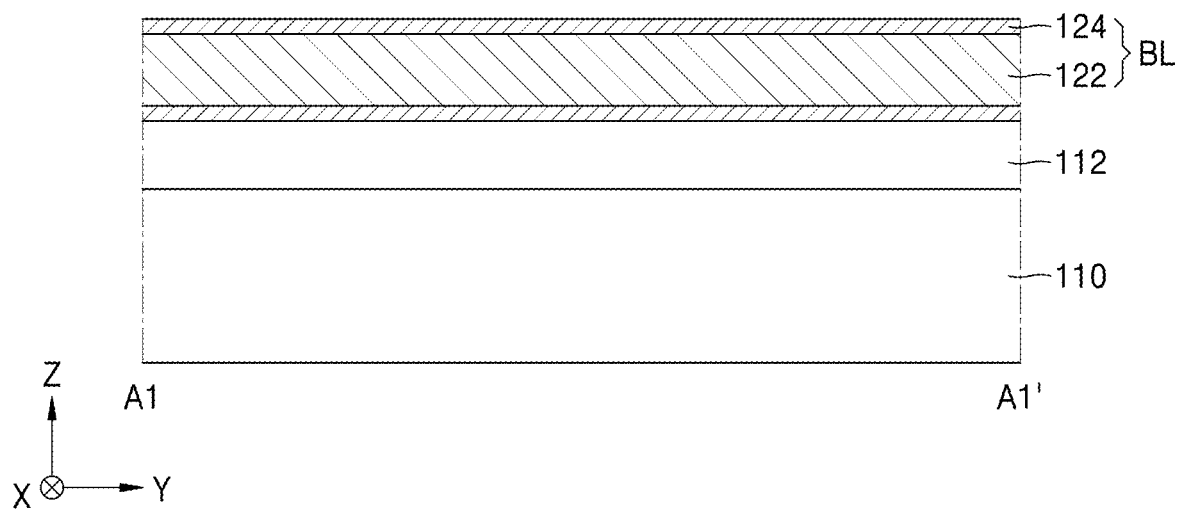

With reference to FIG. 11, the lower insulating layer 112 may be formed on the substrate 110. Then, the plurality of bit lines BL extending in the second horizontal direction (Y direction) and a bit line insulating layer (not shown) filling a space between the plurality of bit lines BL may be formed on the lower insulating layer 112.

In some example embodiments, each of the plurality of bit lines BL may include the conductive barrier layer 124, the conductive layer 122, and the conductive barrier layer 124, which are sequentially disposed. For example, the bit line insulating layer may be formed on the lower insulating layer 112, a bit line formation space (not shown) may be formed by patterning the bit line insulating layer using a mask pattern (not shown), and the conductive barrier layer 124, the conductive layer 122, and the conductive barrier layer 124 may be sequentially formed in the bit line formation space. Then, by removing a top portion of the conductive barrier layer 124, the conductive layer 122, and the conductive barrier layer 124 so that a top surface of the bit line insulating layer is exposed, the plurality of bit lines BL may be formed.

Figure 12:
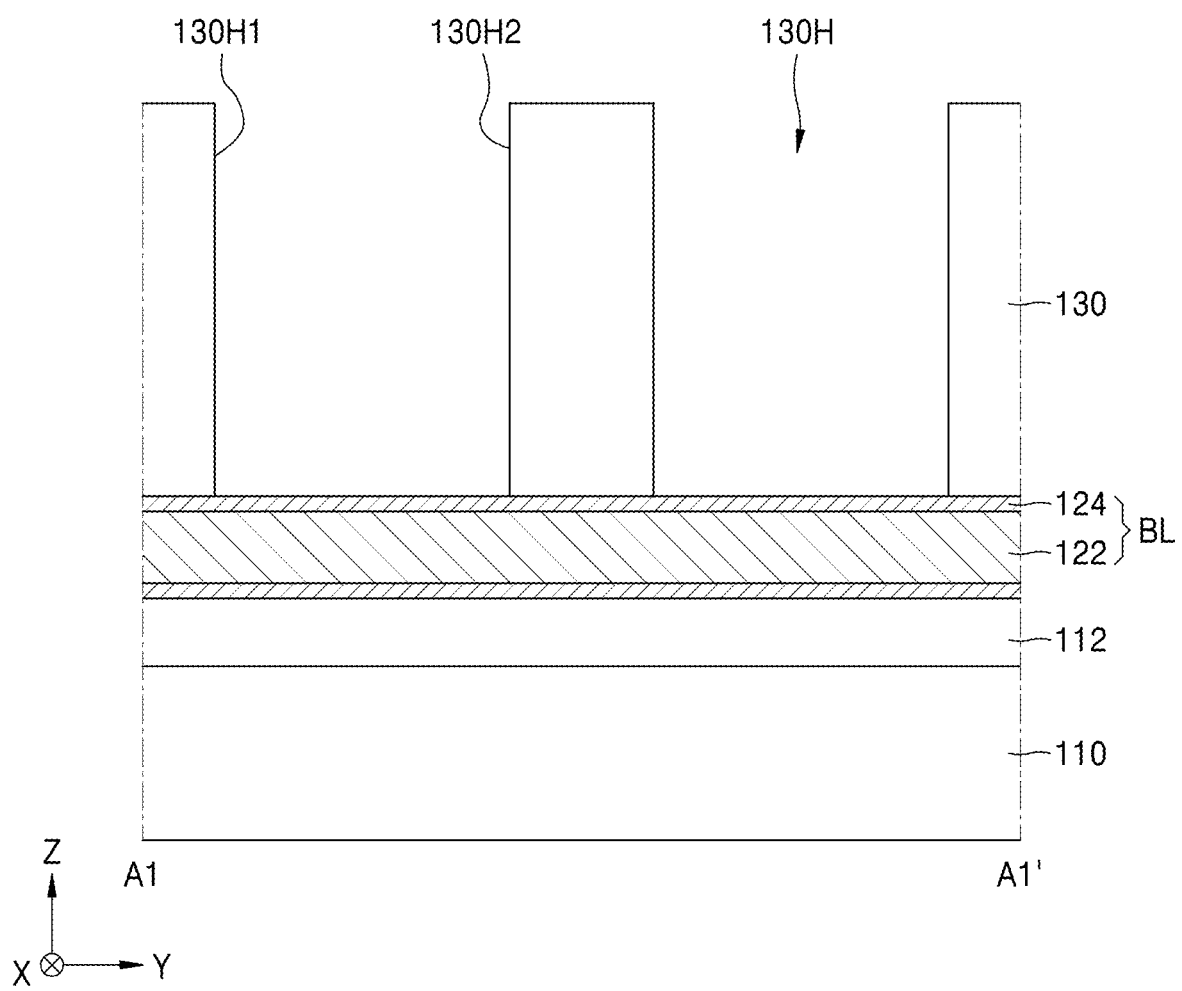

With reference to FIG. 12, the mold insulating layer 130 may be formed on the plurality of bit lines BL and the bit line insulating layer. The mold insulating layer 130 may be formed to have a relatively great height in the vertical direction (Z direction) by using at least one of a silicon oxide, a silicon nitride, and a silicon oxynitride.

Afterwards, the mask pattern (not shown) may be formed on the mold insulating layer 130, and by using the mask pattern as an etching mask, the plurality of mold openings 130H may be formed. A top surface of the bit line BL may be exposed at the bottom portion of the plurality of mold openings 130H. The plurality of mold openings 130H may include the first side wall 130H1 and the second side wall 130H2, which are opposite to each other.

Figure 13:
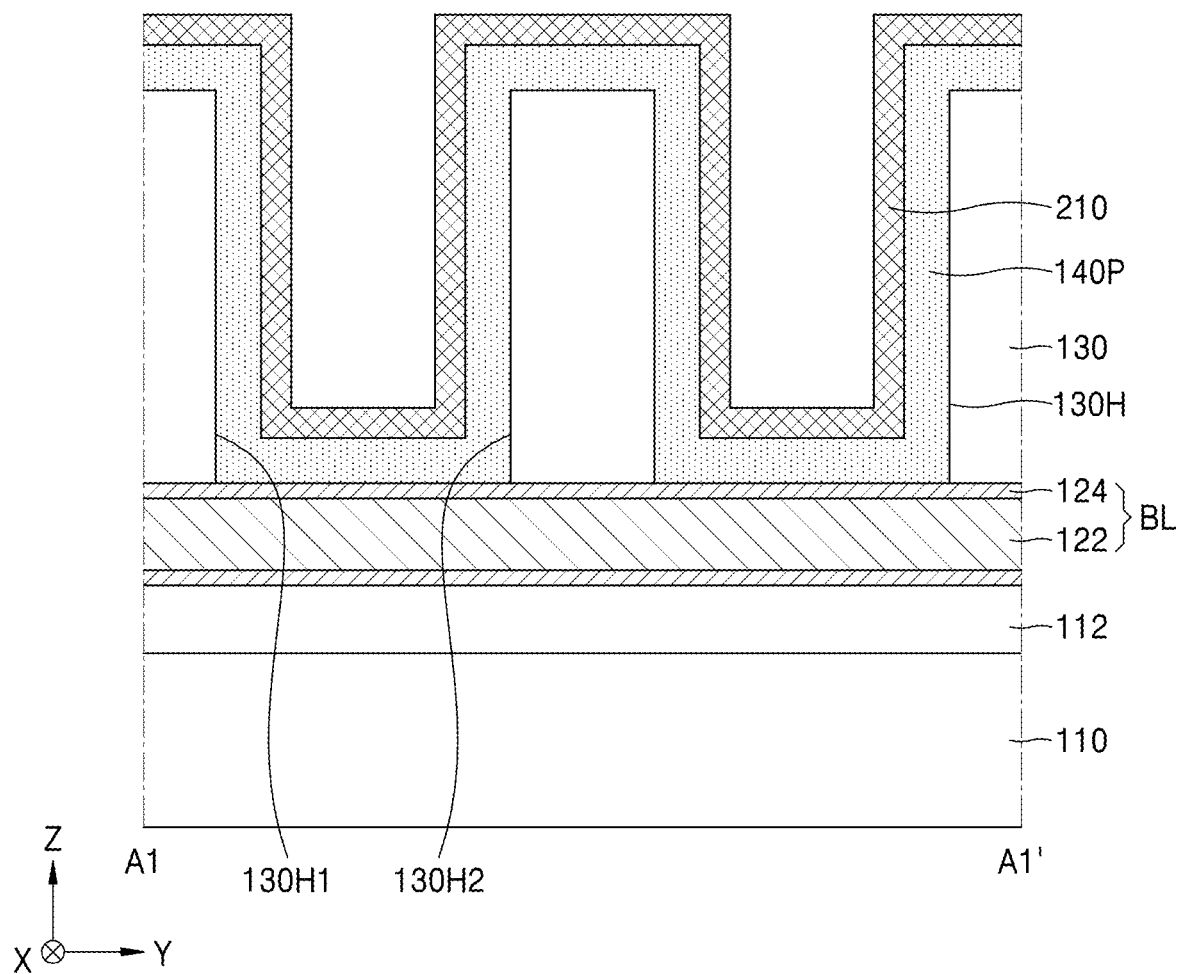

With reference to FIG. 13, the preliminary active semiconductor layer 140P may be formed on the mold insulating layer 130 to conformally cover the inner wall of the mold opening 130H.

In some example embodiments, the preliminary active semiconductor layer 140P may be formed by using an oxide semiconductor material. For example, the preliminary active semiconductor layer 140P may include at least one of IGZO ($InGaZnO_x$), IWO ($InWO_x$), ITGO ($InSnGaO_x$), IAZO ($InAlZnO_x$), IGO ($InGaO_x$), and ITZO ($InSnZnO_x$). The preliminary active semiconductor layer 140P may have the first oxygen content.

In some example embodiments, the preliminary active semiconductor layer 140P may be formed by using at least one of a chemical vapor deposition (CVD) process, a low-pressure CVD process, a plasma-enhanced CVD process, a metal organic CVD (MOCVD) process, and an atomic layer deposition process.

Then, a passivation layer 210 may be formed on the preliminary active semiconductor layer 140P. The passivation layer 210 may be formed by using an aluminum oxide or a silicon oxide, and may have a thickness of, for example, about 10 nm to about 30 nm.

Figure 14:
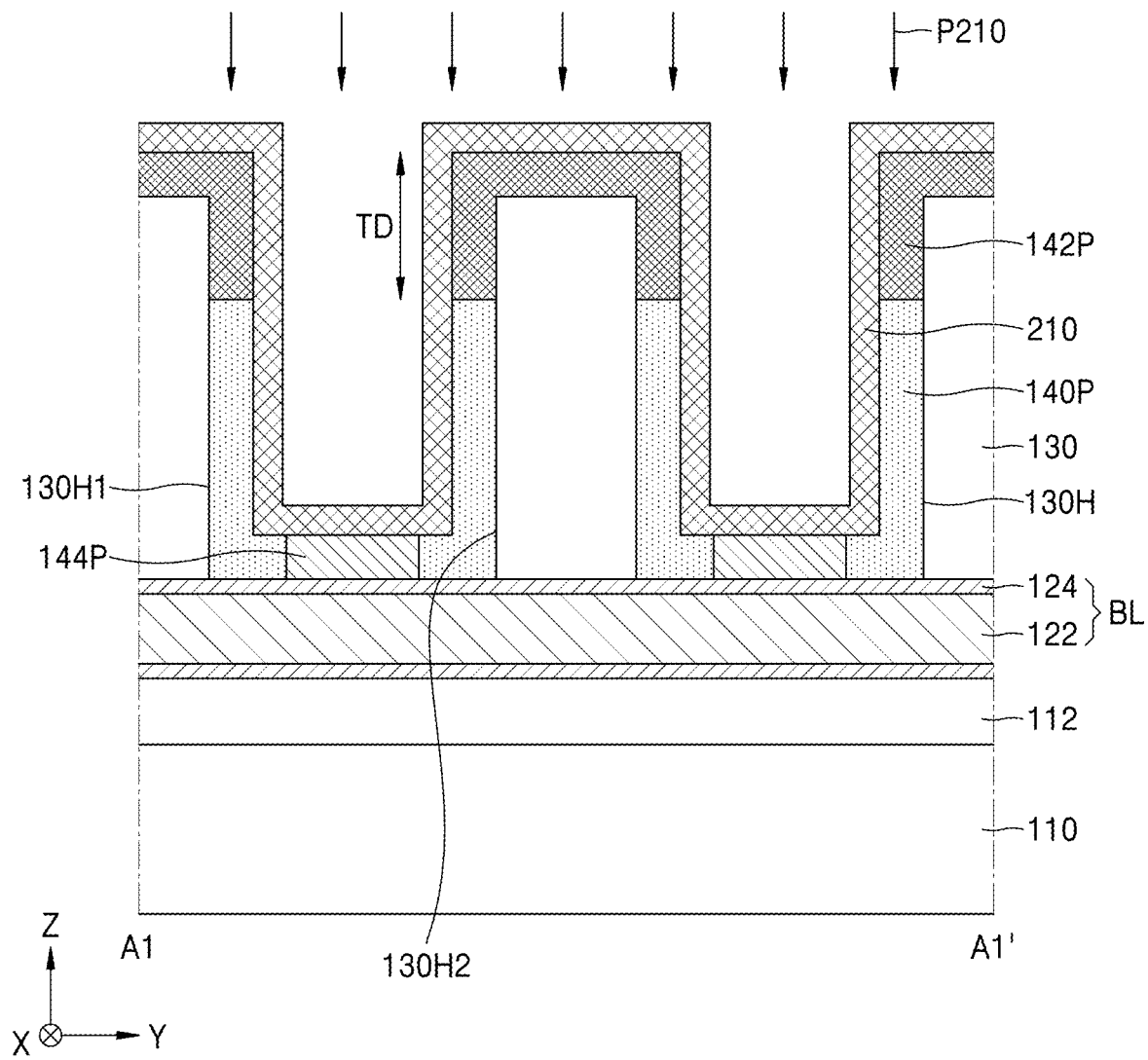

With reference to FIG. 14, by performing the ion-implanting process P210 on the preliminary active semiconductor layer 140P, a dopant may be implanted in an area having a certain thickness from the top surface of the preliminary active semiconductor layer 140P. The ion-implanting process P210 may be performed by implanting a certain dose of at least one dopant from indium, tin, bismuth, and tungsten. The ion-implanting process P210 may be performed by using proper ion implantation energy and dose to implant the dopant into a target depth range TD from the top surface of the preliminary active semiconductor layer 140P. For example, a first contact area 142P may be formed by implanting a dopant into the preliminary active semiconductor layer 140P arranged on the upper side wall of the mold opening 130H, and a second contact area 144P may be formed by implanting a dopant into the preliminary active semiconductor layer 140P arranged on the bottom portion of the mold opening 130H.

In some example embodiments, the target depth range TD may be determined by considering a relative vertical position of the word line WL and the first contact area 142P and a relative vertical position of the word line WL and a landing pad 170, which are to be formed in a subsequent process. For example, the target depth range TD may be determined such that the word line WL overlaps a part of the first contact area 142P in the horizontal direction and such that a bottom surface of the first contact area 142P is spaced apart from the top surface of the word line WL by the first distance D1 (see FIG. 5), e.g., about 2 nm to about 10 nm.

Then, the passivation layer 210 may be removed.

Figure 15A:
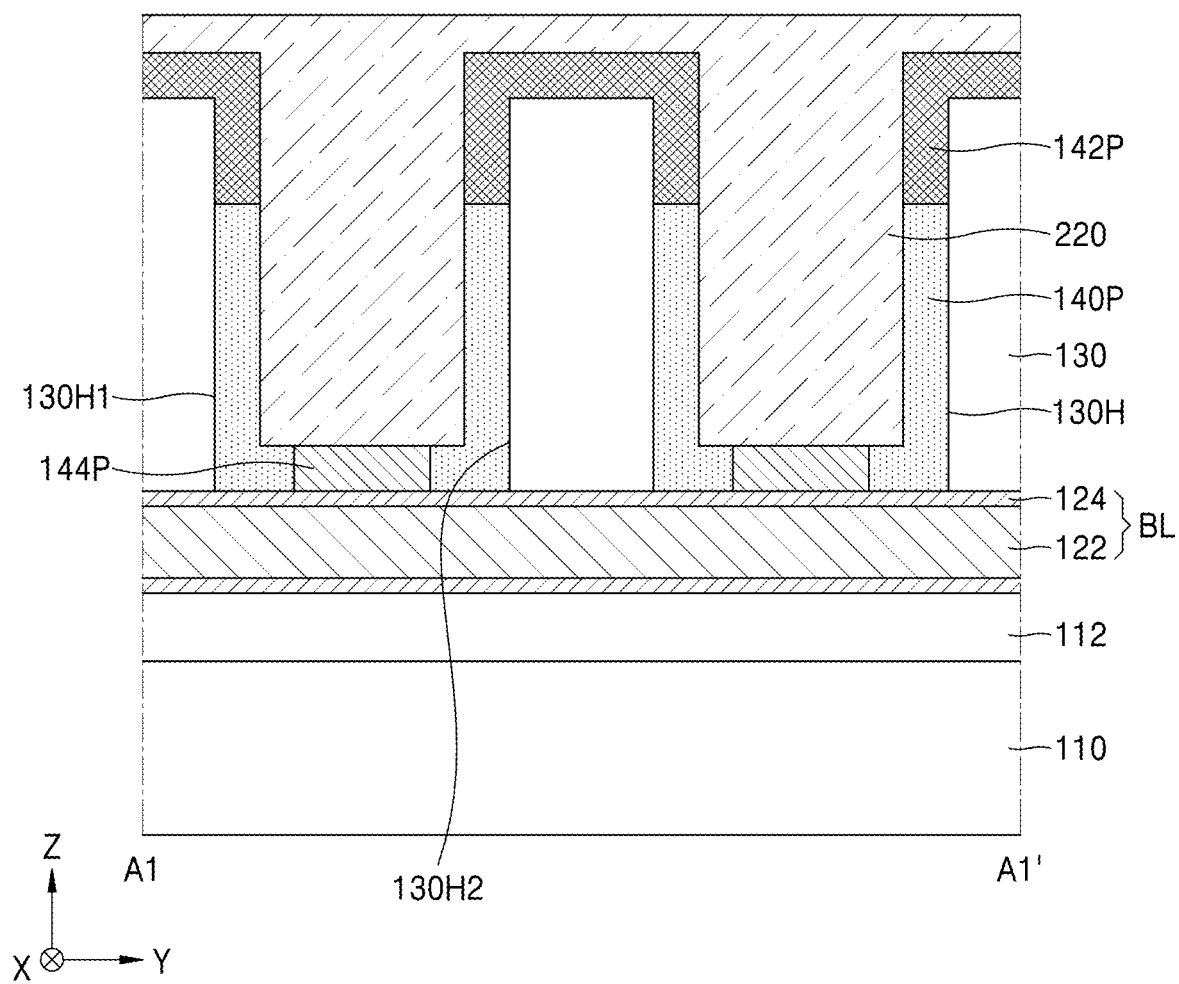
Figure 15B:
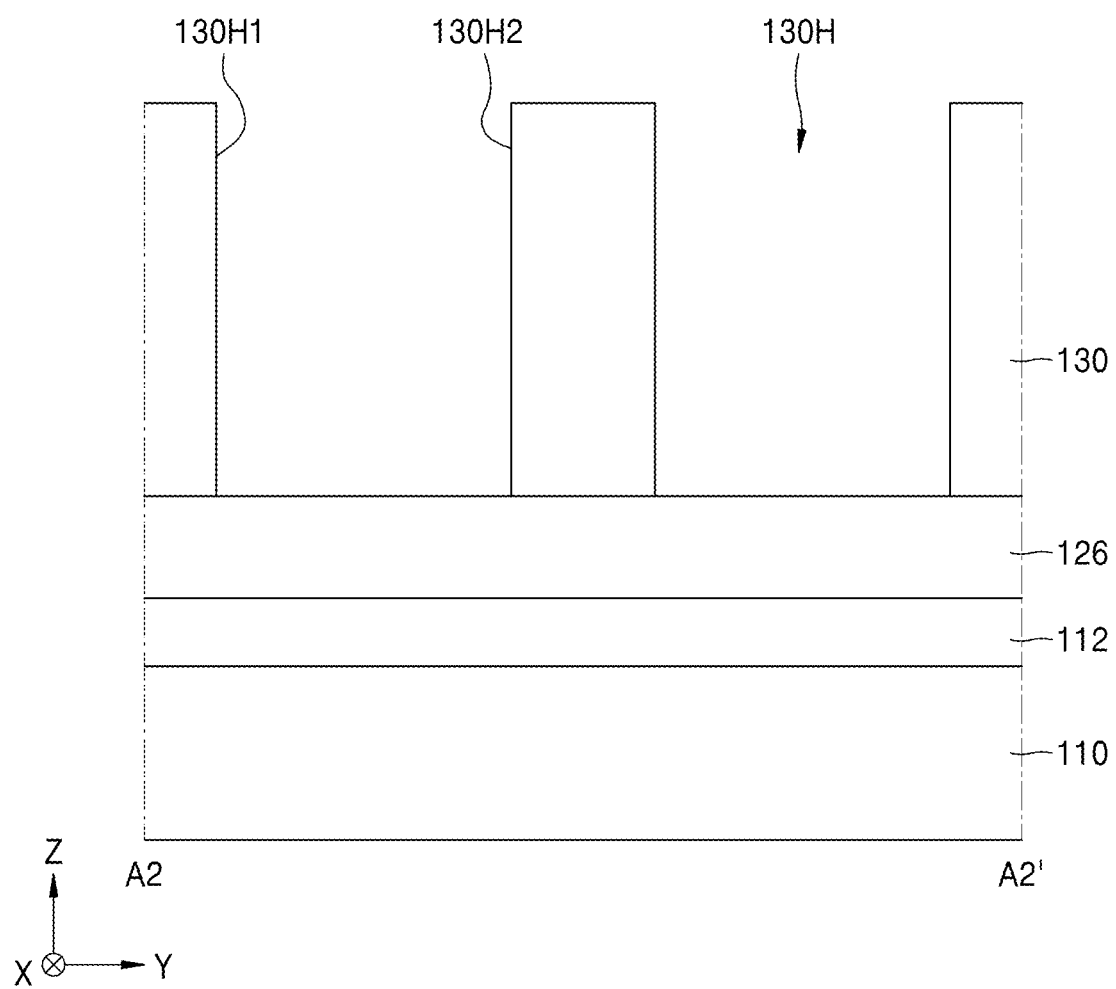

With reference to FIGS. 15A and 15B, a first mask layer 220 may be formed on the preliminary active semiconductor layer 140P. The first mask layer 220 may have a thickness sufficient to entirely fill the mold opening 130H.

Afterwards, a mask pattern (not shown) may be formed on the first mask layer 220, and by using the mask pattern and the first mask layer 220 as an etching mask, a part of the preliminary active semiconductor layer 140P may be removed. For example, the mask pattern may have a shape of a line extending in the second horizontal direction (Y direction), and accordingly, the preliminary active semiconductor layer 140P may remain to extend in the second horizontal direction (Y direction) on the inner wall of the mold opening 130H and the top surface of the mold insulating layer 130.

Moreover, as a part of the preliminary active semiconductor layer 140P is removed, the top surface of the bit line insulating layer 126 may be exposed again to the bottom portion of the mold opening 130H.

Figure 16A:
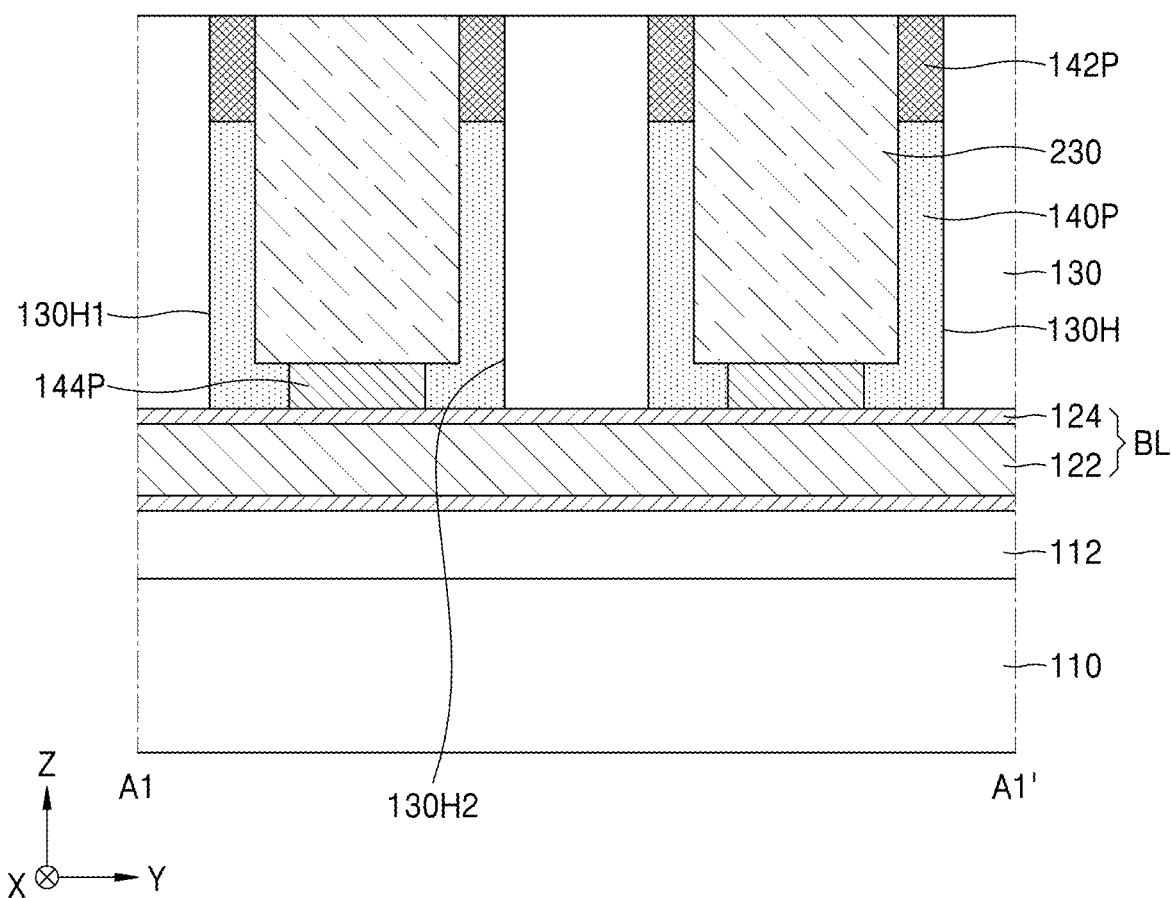
Figure 16B:
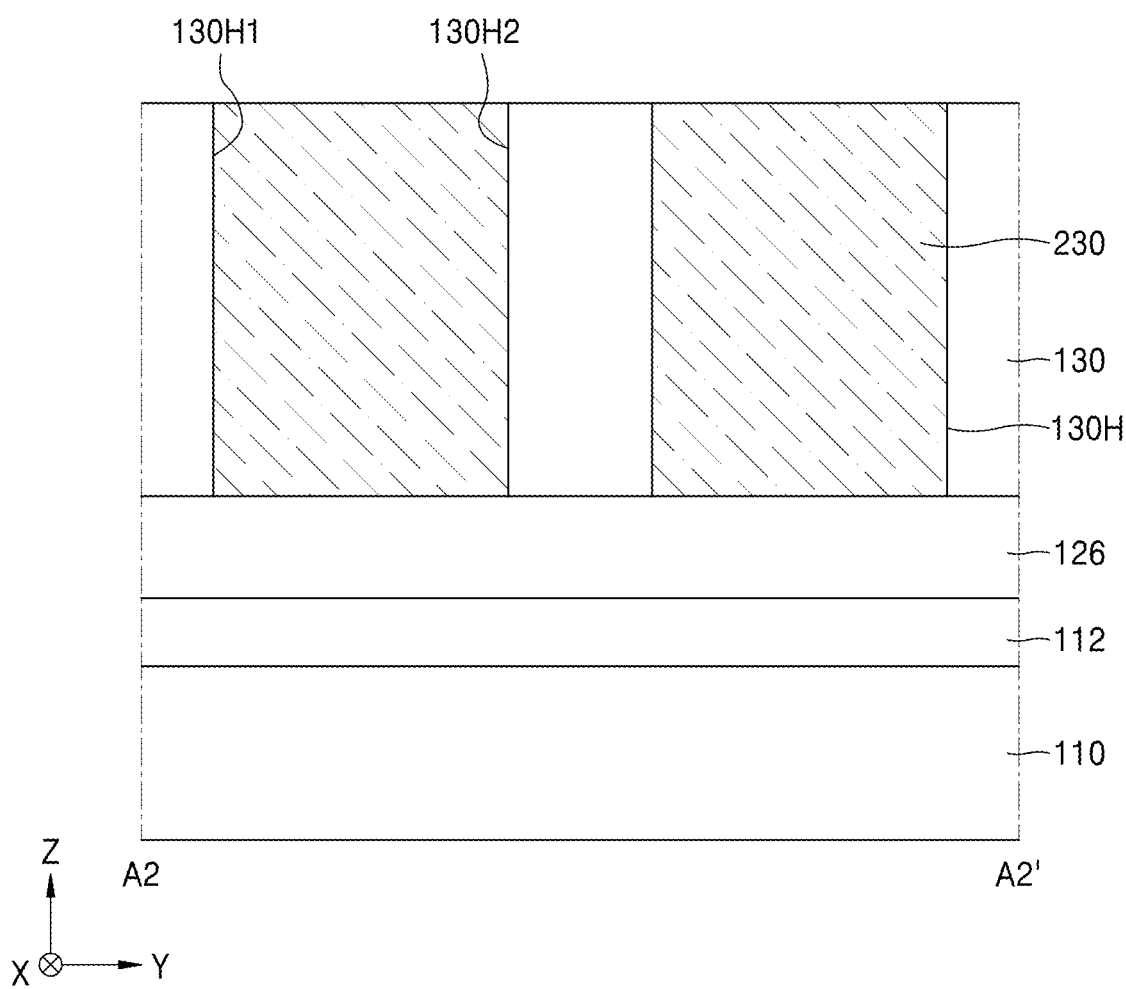

With reference to FIGS. 16A and 16B, the first mask layer 220 may be removed.

Then, a second mask layer 230 may be formed on the mold insulating layer 130 and the preliminary active semiconductor layer 140P. The second mask layer 230 may have a thickness sufficient to completely fill the mold opening 130H, and accordingly, the top surface of the preliminary active semiconductor layer 140P arranged on the top surface of the mold insulating layer 130 may be covered by the second mask layer 230.

By performing a planarization process on an upper portion of the second mask layer 230, a part of the preliminary active semiconductor layer 140P arranged on the top surface of the mold insulating layer 130 may be removed, and the preliminary active semiconductor layer 140P may remain on the inner wall of the mold opening 130H. As a part of the preliminary active semiconductor layer 140P arranged on the top surface of the mold insulating layer 130 is removed, a plurality of preliminary active semiconductor layers 140P arranged apart from each other in the first horizontal direction (X direction) and the second horizontal direction (Y direction) may be defined so that one preliminary active semiconductor layer 140P may be placed in a position where one mold opening 130H intersects one bit line BL.

Figure 17:
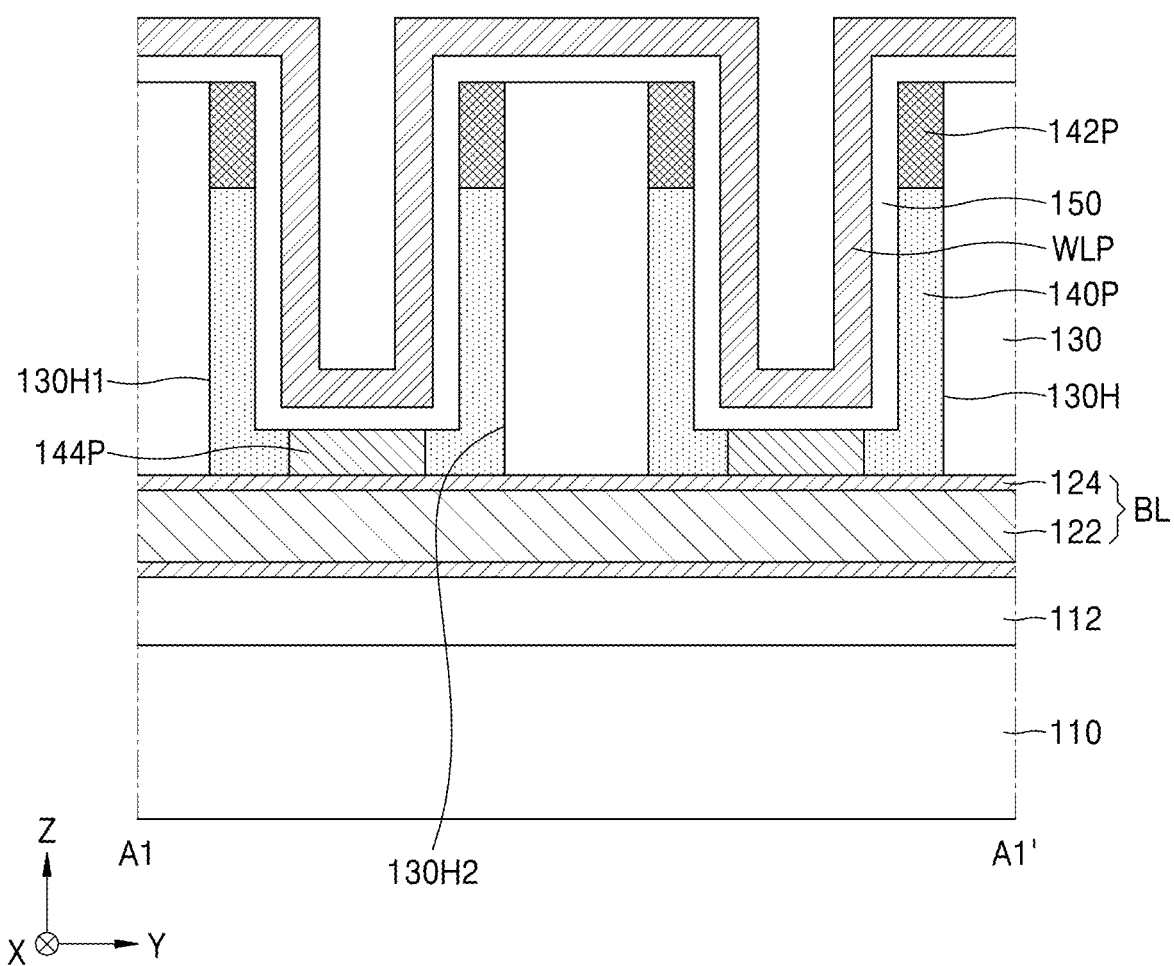

With reference to FIG. 17, the gate insulating layer 150 and a word line metal layer WLP may be sequentially formed on the preliminary active semiconductor layer 140P.

The gate insulating layer 150 may include at least one selected from a high-k dielectric material having a higher dielectric constant than a silicon oxide and a ferroelectric material. In some embodiments, the gate insulating layer 150 may include at least one material selected from hafnium oxide (HfO), hafnium silicate (HfSiO), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), lead zirconium titanate (PZT), bismuth ferrite oxide (BFO), strontium titanium oxide (SrTiO), yttrium oxide (YO), aluminum oxide (AlO), and lead scandium tantalum oxide (PbScTaO).

In some example embodiments, the word line metal layer WLP may include Ti, TiN, Ta, TaN, Mo, Ru, W, WN, TiSiN, WSiN, polysilicon, or a combination thereof.

Figure 18:
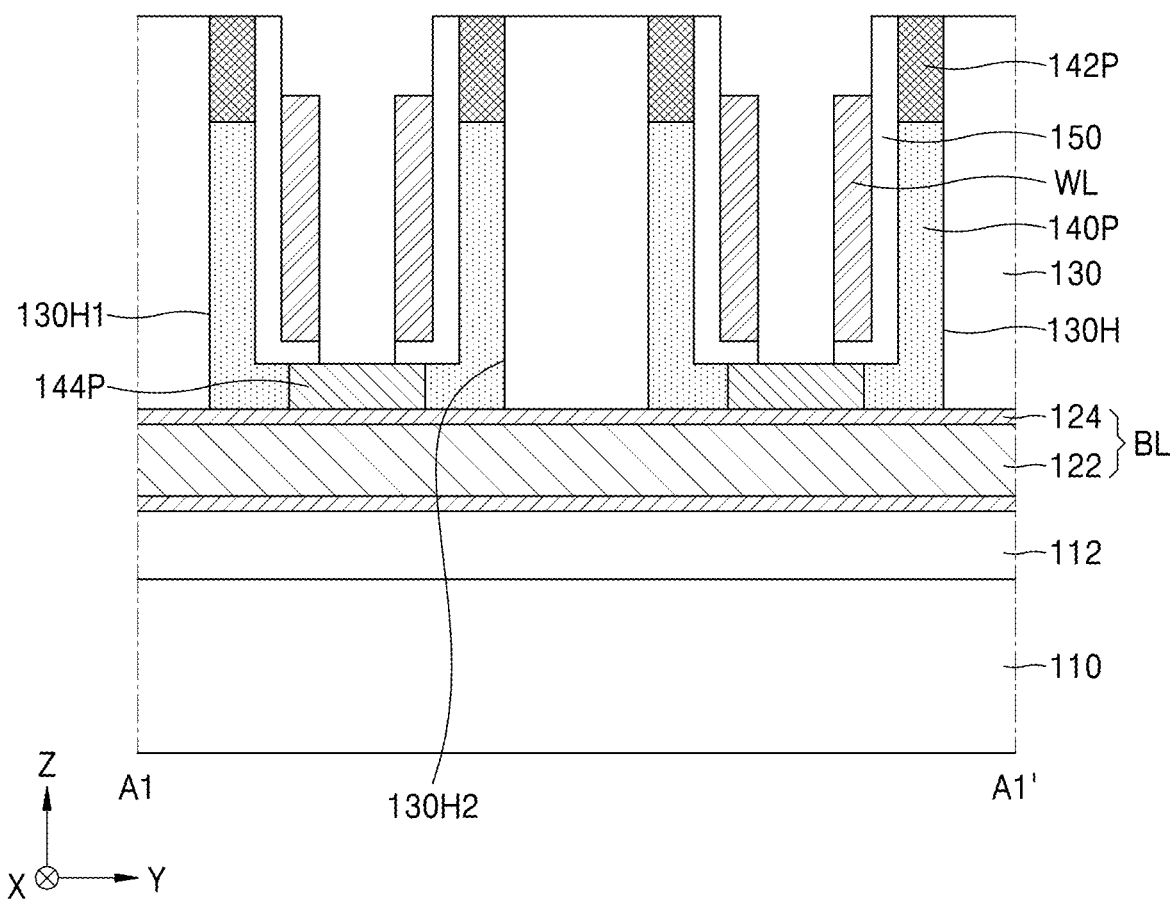

With reference to FIG. 18, by performing an anisotropic etching process on the word line metal layer WLP, a part of the word line metal layer WLP arranged on the bottom portion of the mold opening 130H may be removed, and the word line WL may remain on the first side wall 130H1 and the second side wall 130H2 of the mold opening 130H. By the anisotropic etching process, a part of the word line metal layer WLP arranged on the top surface of the mold insulating layer 130 may also be removed. After the anisotropic etching process, two word lines WL spaced apart from each other may be arranged on each of the first side wall 130H1 and the second side wall 130H2 of the plurality of mold openings 130H.

A part of the gate insulating layer 150 arranged on the bottom portion of the mold opening 130H may be removed by the anisotropic etching process, and due to this, the top surface of the preliminary active semiconductor layer 140P may be exposed at the bottom portion of the mold opening 130H. Moreover, by the anisotropic etching process, a part of the gate insulating layer 150 arranged on the top surface of the mold insulating layer 130 may be removed as well, and the top surface of the mold insulating layer 130 may be exposed.

Figure 19:
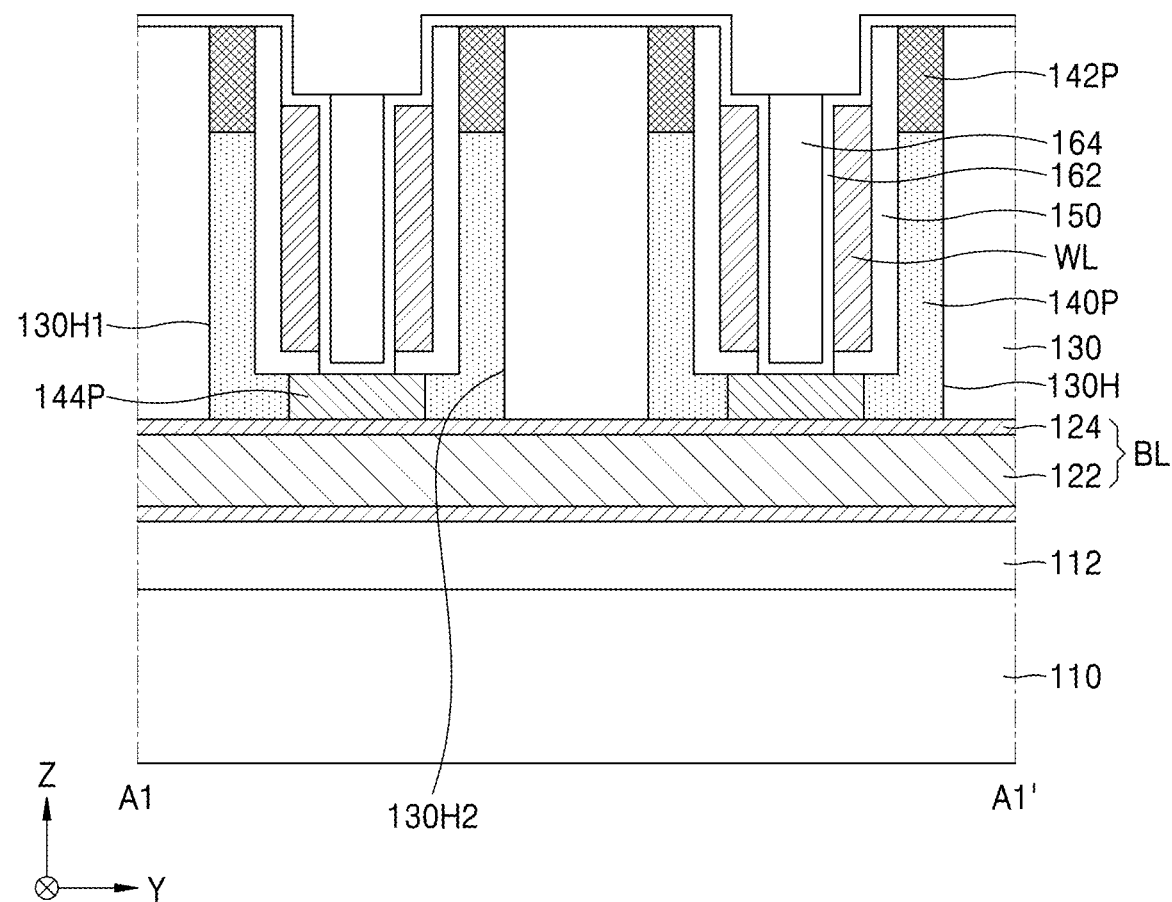

With reference to FIG. 19, the insulating liner 162 and the buried insulating layer 164 may be formed in the mold opening 130H. The insulating liner 162 may be conformally arranged on the top surface of the word line WL, on the top surface of the preliminary active semiconductor layer 140P, and on the top surface of the mold insulating layer 130, and the buried insulating layer 164 may fill the mold opening 130H on the insulating liner 162.

In some example embodiments, an etch-back process may be performed on an upper portion of the buried insulating layer 164, and the top surface of the buried insulating layer 164 may be placed at the same level as the top surface of the insulating liner 162 arranged on the top surface of the word line WL.

Figure 20:
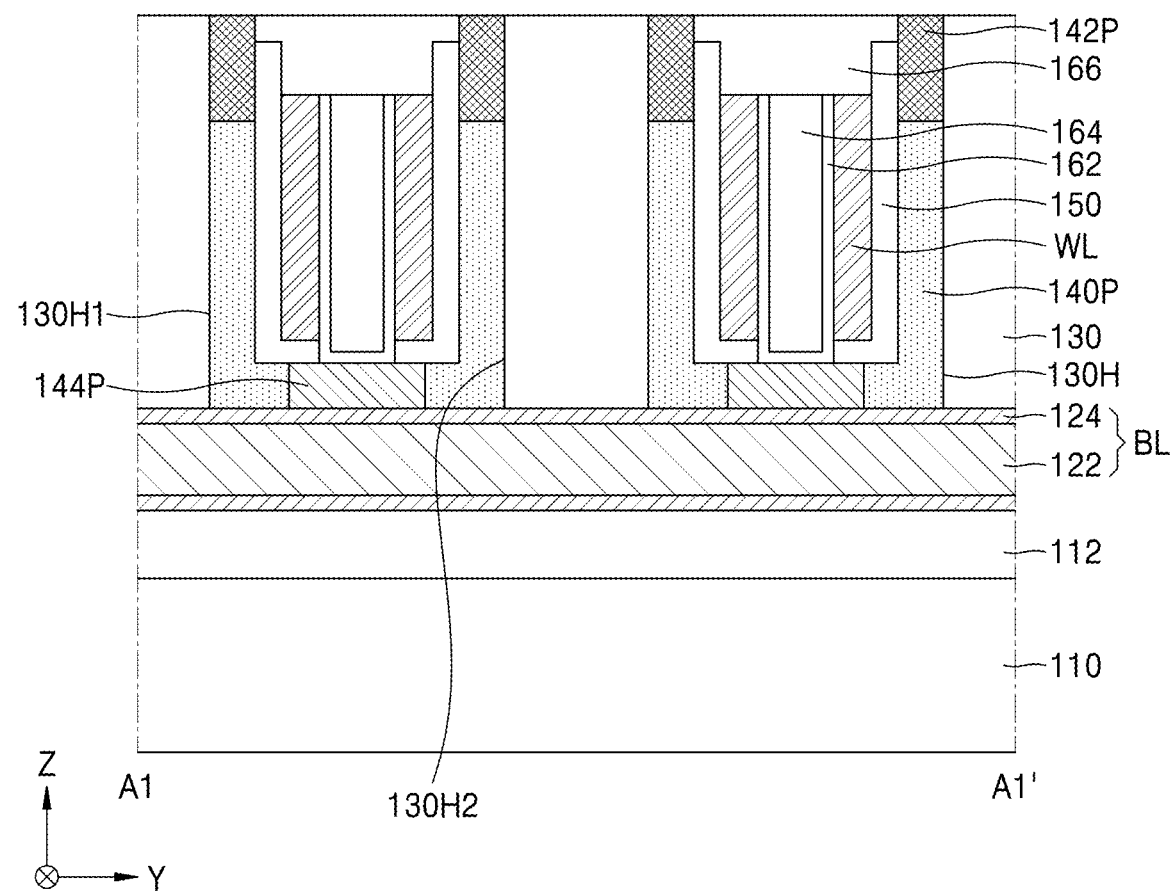

With reference to FIG. 20, the upper insulating layer 166 may be formed on the insulating liner 162 and the buried insulating layer 164 arranged in the mold opening 130H. In the etch-back process of the buried insulating layer 164 and/or the process for forming the upper insulating layer 166, an upper portion of the gate insulating layer 150 may be removed, and the top surface of the gate insulating layer 150 may be arranged at a level lower than the top surface of the upper insulating layer 166; however, the technical ideas of the inventive concepts are not limited thereto. The top surface of the upper insulating layer 166 may be arranged at the same level as the top surface of the mold insulating layer 130 and the first contact area 142P.

Figure 21:
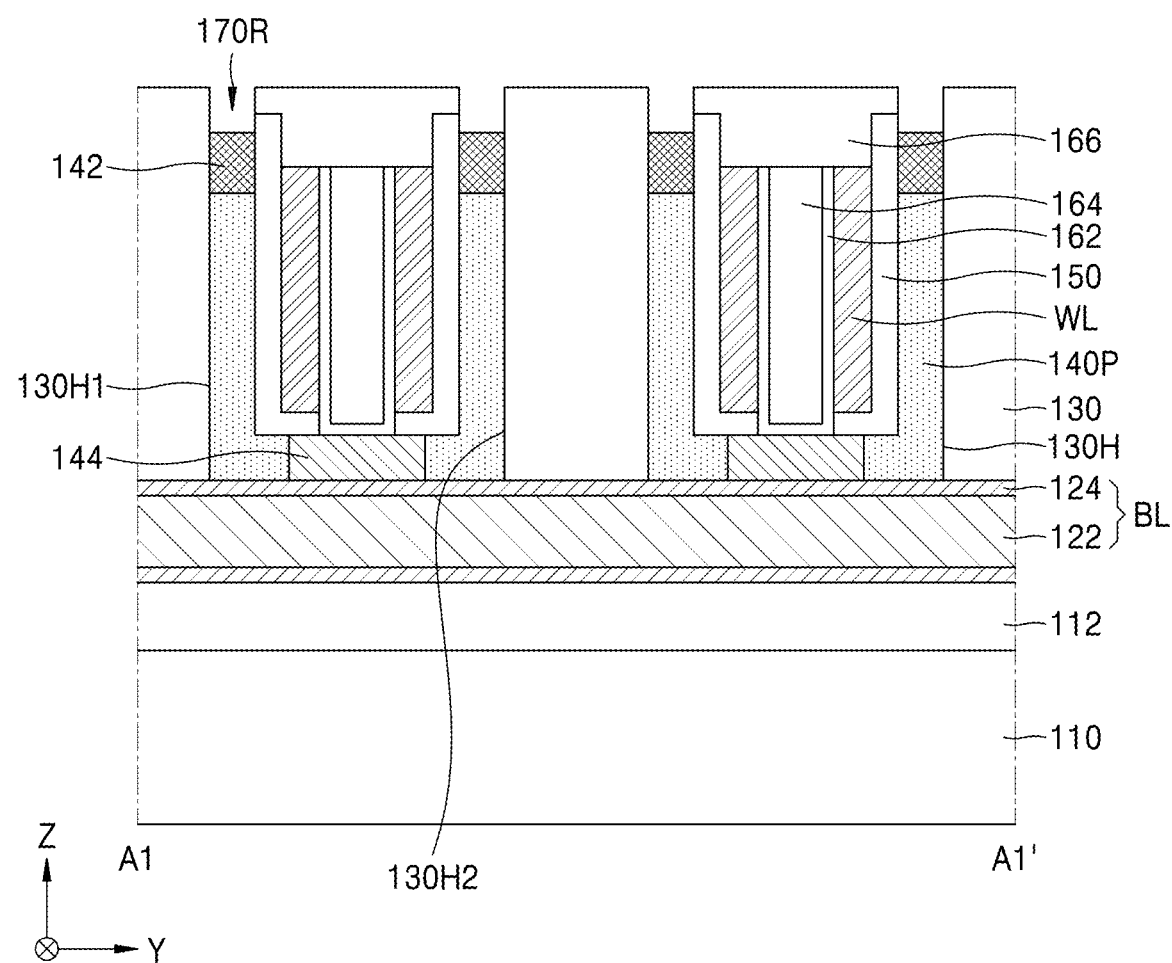

With reference to FIG. 21, an upper part of the first contact area 142P may be removed by the etch-back process, and the landing pad recess 170R may be formed. The landing pad recess 170R may be defined by the upper insulating layer 166 and the mold insulating layer 130, and the first contact area 142P may be arranged at a bottom portion of the landing pad recess 170R. An upper part of the first contact area 142P, which is removed by the landing pad recess 170R, may be referred to as the first contact 142. Moreover, the second contact area 144P, which is arranged on the bottom portion of the mold opening 130H, may be referred to as the second contact 144.

As the first contact 142 is arranged on the bottom portion of the landing pad recess 170R, the bottom surface of the landing pad recess 170R may be placed at a level higher than the top surface of the word line WL, and the landing pad recess 170R may be formed to have a relatively small depth.

Figure 22:
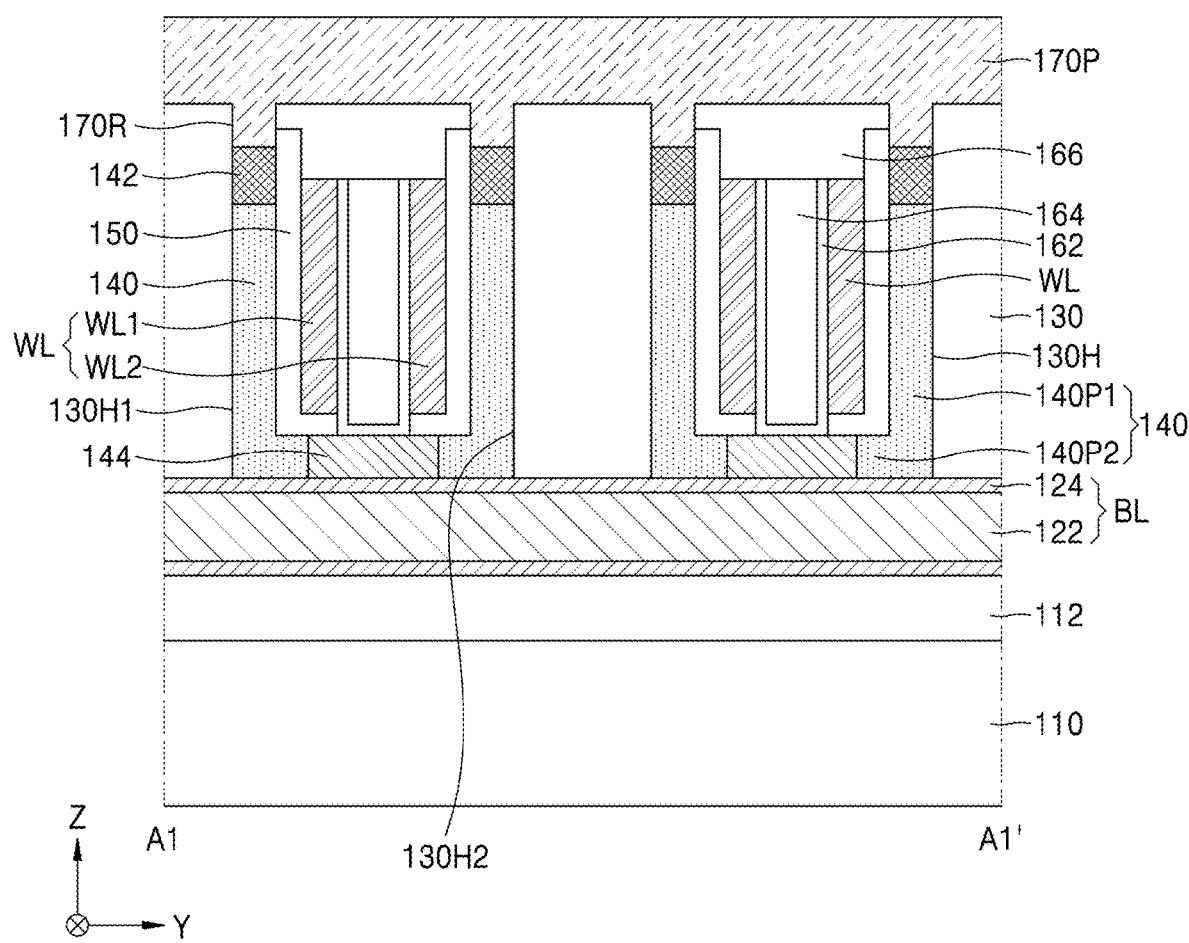

With reference to FIG. 22, a landing pad conductive layer 170P may be formed on the mold insulating layer 130 and the upper insulating layer 166. The landing pad conductive layer 170P may fill the landing pad recess 170R and be in contact with the top surface of the first contact 142.

In some example embodiments, the landing pad conductive layer 170P may include Ti, TiN, Ta, TaN, W, WN, TiSiN, WSiN, polysilicon, or a combination thereof.

Figure 23:
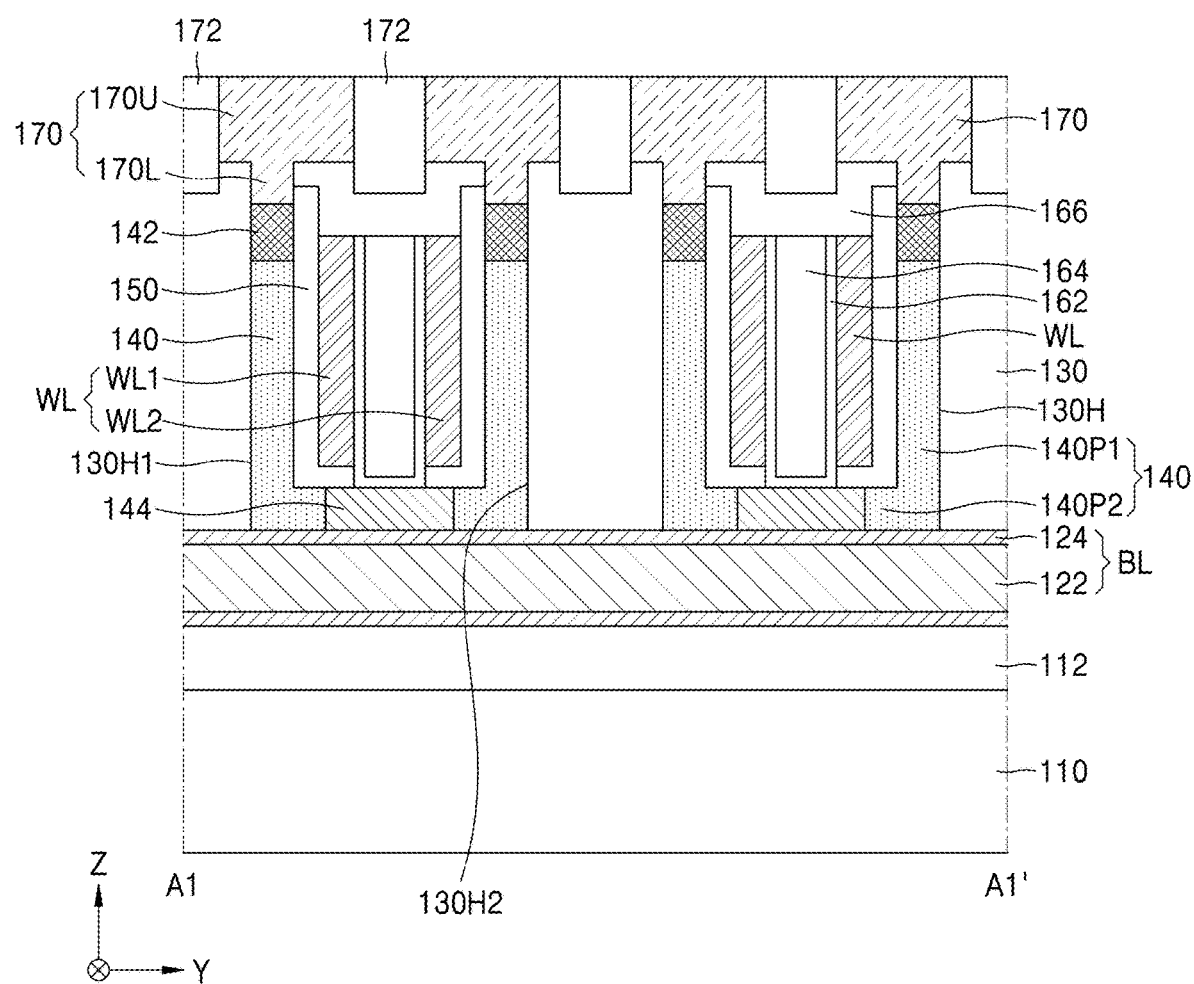

With reference to FIG. 23, a mask pattern (not shown) may be formed on the landing pad conductive layer 170P, and a part of the landing pad conductive layer 170P may be removed by using the mask pattern to form the landing pad 170. The, the landing pad insulating layer 172 may be formed in an area where the landing pad conductive layer 170P is removed.

In some example embodiments, the landing pad insulating layer 172 may be formed by using a silicon nitride.

Referring back to FIG. 3, the etch stop layer 180 may be formed on the landing pad 170 and the landing pad insulating layer 172. The etch stop layer 180 may include the opening 180H, and the top surface of the landing pad 170 may be exposed at a bottom portion of the opening 180H.

Then, the lower electrode 182, the capacitor dielectric layer 184, and the upper electrode 186 may be sequentially formed on the etch stop layer 180.

By performing the foregoing process, the semiconductor device 100 may be completed.

According to some example embodiments, by the ion implanting process, the first contact 142 and the second contact 144 may be formed from the preliminary active semiconductor layer 140P. As the first contact 142 has the top surface arranged at a level higher than the top surface of the word line WL, the depth of the landing pad recess 170R may be relatively small, and overlap between the landing pad 170 and the word line WL in the horizontal direction may be prevented. Accordingly, damage, etc. to the gate insulating layer 150, which may be caused when forming the landing pad recess 170R in a great depth, may be reduced or prevented. Therefore, the semiconductor device 100 may have a reduced leakage current and contact resistance as well as excellent electrical characteristics.

Figure 24:
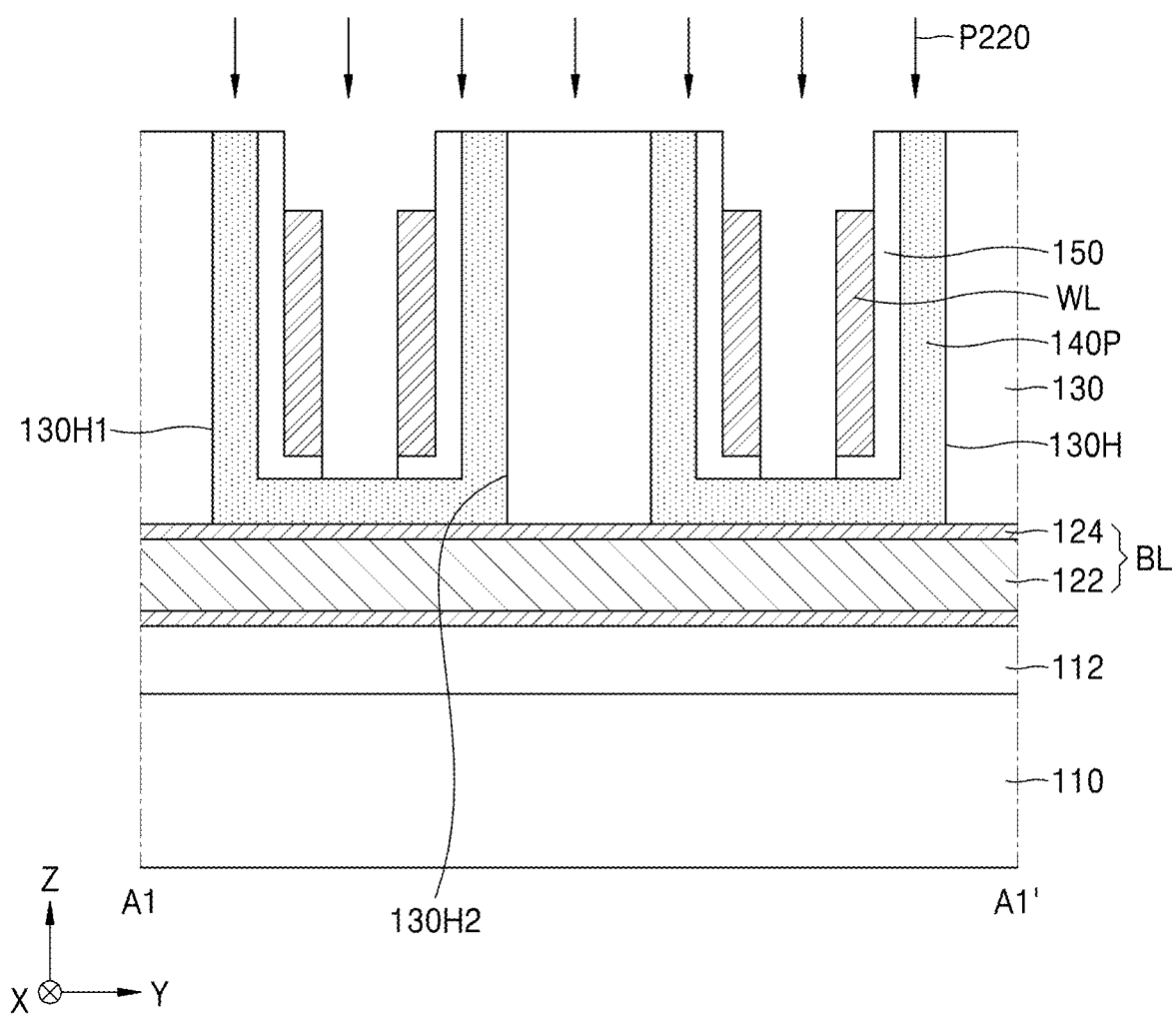
FIGS. 24 and 25 are cross-sectional views illustrating a method of manufacturing a semiconductor device, according to some example embodiments.
Figure 25:
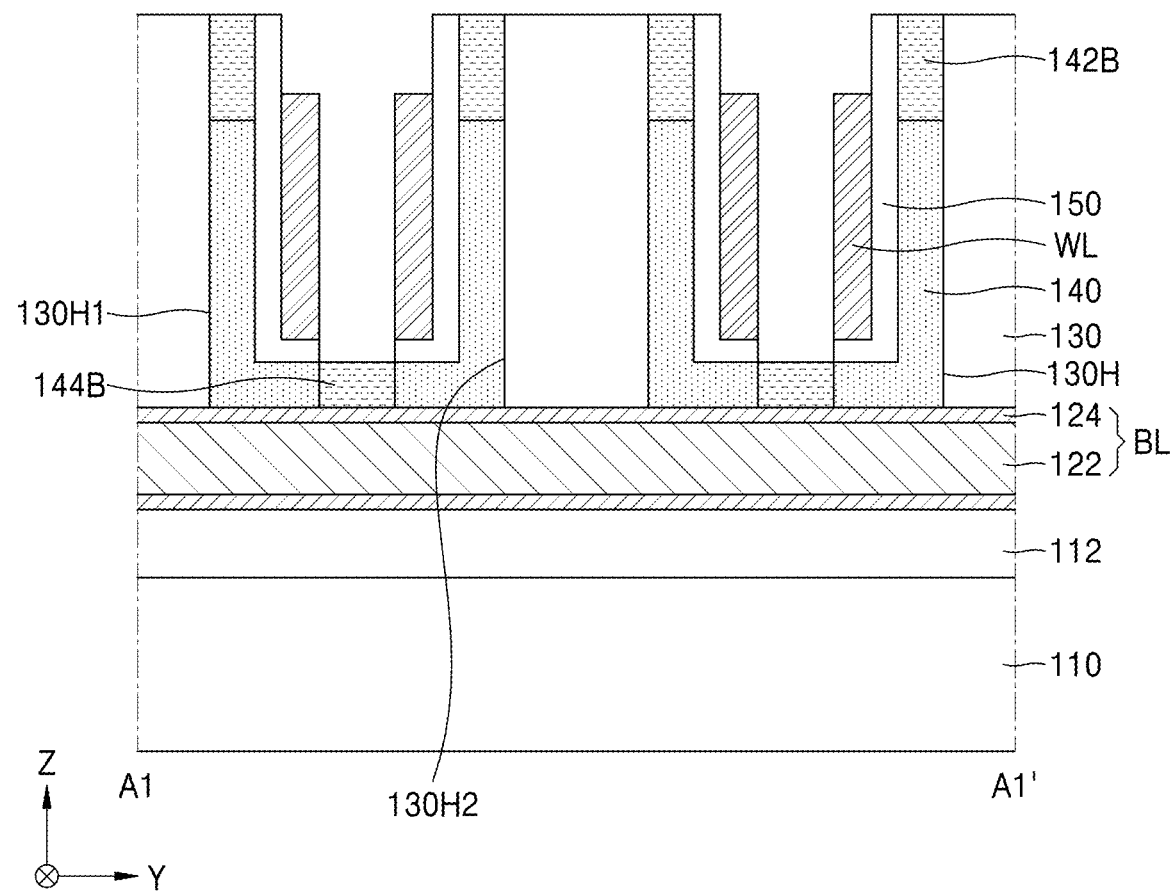

FIGS. 24 and 25 are cross-sectional views illustrating a method of manufacturing the semiconductor device 100B according to some example embodiments.

By performing the process described with reference to FIGS. 11 to 13, the preliminary active semiconductor layer 140P conformally covering the inner wall of the mold opening 130H may be formed on the mold insulating layer 130. Then, the ion implanting process described with reference to FIG. 14 may be omitted, and by performing the processes described with reference to FIGS. 15A to 18, a structure in which the gate insulating layer 150 and the word line WL are arranged on the preliminary active semiconductor layer 140P may be formed.

With reference to FIG. 24, the hydrogen or deuterium plasma treatment P220 may be performed on an exposed surface of the preliminary active semiconductor layer 140P. For example, the first contact 142B may be formed on the upper side wall of the mold opening 130H, and the second contact 144B may be formed on the bottom portion of the mold opening 130H.

In some example embodiments, in the hydrogen or deuterium plasma treatment P220, a diffusion length of hydrogen or deuterium may be properly adjusted. The diffusion length of hydrogen or deuterium may be determined by considering a relative vertical position of the word line WL and the first contact 142B and a relative vertical position of the word line WL and the landing pad 170 which are to be formed in a subsequent process.

For example, the diffusion length of hydrogen or deuterium may be determined such that the word line WL overlaps a part of the first contact 142B in the horizontal direction and such that a bottom surface of the first contact 142B is spaced apart from the top surface of the word line WL by the first distance D1 (see FIG. 5), e.g., about 2 nm to about 10 nm.

In some embodiments, selectively, after performing the hydrogen or deuterium plasma treatment on the surface of the preliminary active semiconductor layer 140P, the surface of the preliminary active semiconductor layer 140P may be exposed to liquid or gaseous state hydrogen peroxide ($H_2O_2$) or liquid or gaseous state deuterium peroxide ($D_2O_2$) and then the ultraviolet irradiation process may be performed.

With reference to FIG. 25, as a result of the hydrogen or deuterium plasma treatment, the first contact 142B and the second contact 144B may be formed.

The first contact 142B and the second contact 144B may further include an oxygen vacancy formed by the hydrogen or deuterium atoms in the oxide semiconductor material after performing the hydrogen or deuterium plasma treatment. The first contact 142B and the second contact 144B may include an oxide semiconductor material, and may include at least one of, for example, IGZO ($InGaZnO_y$), IWO ($InWO_y$), ITGO ($InSnGaO_y$), IAZO ($InAlZnO_y$), IGO ($InGaO_y$), and ITZO ($InSnZnO_y$). The first contact 142B may have the second oxygen content, and the second oxygen content may be less than the first oxygen content of the active semiconductor layer 140. The second contact 144B may have the third oxygen content, and the third oxygen content may be less than the first oxygen content of the active semiconductor layer 140.

By performing the process described with reference to FIGS. 19 to 23, the semiconductor device 100B may be formed.

Figure 26:
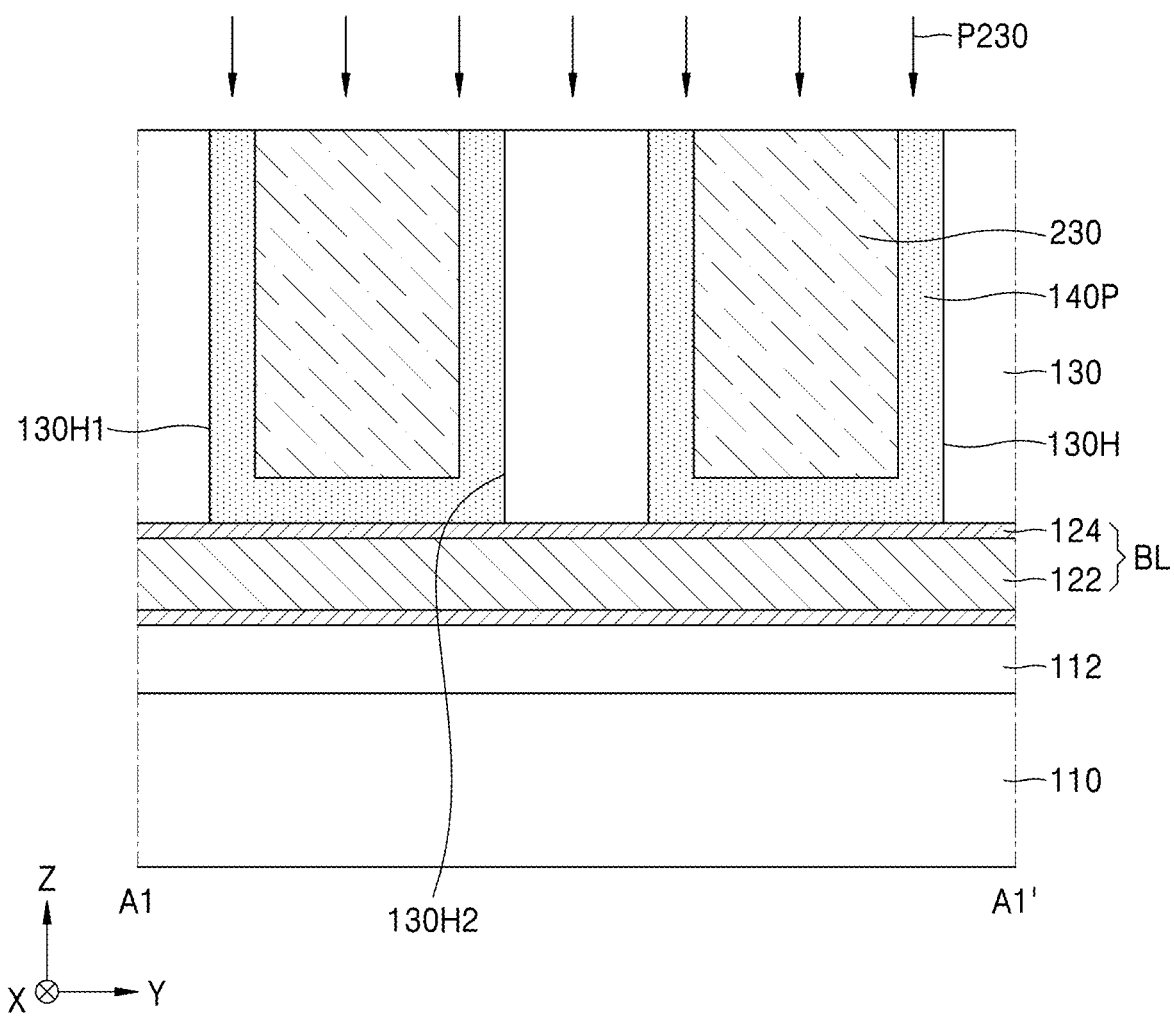
FIGS. 26 and 27 are cross-sectional views illustrating a method of manufacturing a semiconductor device, according to some example embodiments.
Figure 27:
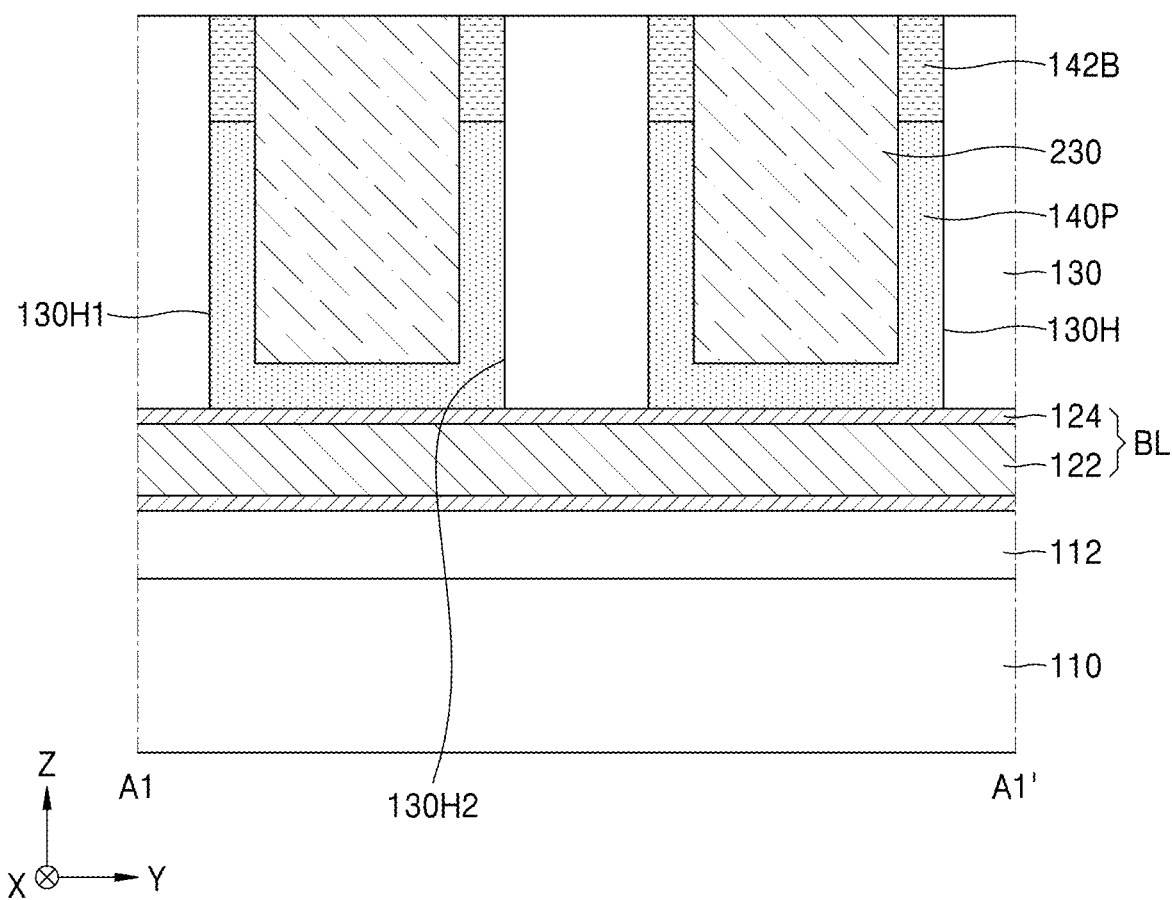

FIGS. 26 and 27 are cross-sectional views illustrating a method of manufacturing a semiconductor device, according to some example embodiments.

By performing the process described with reference to FIGS. 11 to 13, the preliminary active semiconductor layer 140P conformally covering the inner wall of the mold opening 130H may be formed on the mold insulating layer 130. Then, the ion implanting process described with reference to FIG. 14 may be omitted, and by performing the processes described with reference to FIGS. 15A to 16B, a structure in which the second mask layer 230 filling the mold opening 130H is arranged on the preliminary active semiconductor layer 140P may be formed.

With reference to FIG. 26, the hydrogen or deuterium plasma treatment P230 may be performed on the surface of the preliminary active semiconductor layer 140P exposed on the top surface of the mold insulating layer 130. In some example embodiments, in the hydrogen or deuterium plasma treatment P230, a diffusion length of hydrogen or deuterium may be properly adjusted. The diffusion length of hydrogen or deuterium may be determined by considering a relative vertical position of the word line WL and the first contact 142B and a relative vertical position of the word line WL and the landing pad 170 which are to be formed in a subsequent process. For example, the diffusion length of hydrogen or deuterium may be determined such that the word line WL overlaps a part of the first contact 142B in the horizontal direction.

In some embodiments, selectively, after performing the hydrogen or deuterium plasma treatment on the surface of the preliminary active semiconductor layer 140P, the surface of the preliminary active semiconductor layer 140P may be exposed to liquid or gaseous state hydrogen peroxide ($H_2O_2$) or liquid or gaseous state deuterium peroxide ($D_2O_2$) and then the ultraviolet irradiation process may be performed.

According to some example embodiments, a part of the preliminary active semiconductor layer 140P arranged on the bottom portion of the mold opening 130H may not be exposed to the plasma treatment or ultraviolet irradiation process, and an oxygen content of the part of the preliminary active semiconductor layer 140P arranged at the bottom portion of the mold opening 130H may not be changed.

By performing the process described with reference to FIGS. 17 to 23, the semiconductor device 100C may be formed.

While the inventive concepts have been particularly shown and described with reference to embodiments thereof, it will be understood that various changes in form and details may be made therein without departing from the spirit and scope of the following claims.

What is claimed is:

1. A semiconductor device comprising:
   a bit line extending on a substrate in a first horizontal direction;
   an active semiconductor layer on the bit line, the active semiconductor layer having a first portion extending in a vertical direction perpendicular to a top surface of the substrate and a second portion connected to a bottom portion of the first portion and extending in the first horizontal direction, and the active semiconductor layer including an oxide semiconductor material;
   a word line on a first side wall of the active semiconductor layer and extending in a second horizontal direction perpendicular to the first horizontal direction;
   a gate insulating layer between the active semiconductor layer and the word line;
   a first contact on the active semiconductor layer, the first contact having a bottom surface at a level lower than a top surface of the word line and a top surface at a level higher than the top surface of the word line, and the first contact including an oxide semiconductor containing a first dopant;
   a second contact adjacent to the second portion of the active semiconductor layer on the bit line and including an oxide semiconductor containing a second dopant; and
   a landing pad on the first contact.

2. The semiconductor device of claim 1, wherein
   the gate insulating layer is between the first portion of the active semiconductor layer and a side wall of the word line and between the second portion of the active semiconductor layer and a bottom surface of the word line, and
   the gate insulating layer has a top surface at a level higher than the top surface of the first contact and the top surface of the word line.

3. The semiconductor device of claim 1, wherein
   a first side wall of the first contact is aligned with the first side wall of the active semiconductor layer, and
   a second side wall of the first contact opposite to the first side wall of the first contact, is aligned with a second side wall of the active semiconductor layer, the second side wall of the active semiconductor layer being opposite to the first side wall of the active semiconductor layer.

4. The semiconductor device of claim 3, wherein the gate insulating layer is in contact with the first side wall of the first contact and the first side wall of the active semiconductor layer.

5. The semiconductor device of claim 3, further comprising:
   a mold insulating layer on the bit line and covering the second side wall of the active semiconductor layer and the second side wall of the first contact.

6. The semiconductor device of claim 1, wherein the landing pad comprises:
   an upper portion having a first width in the first horizontal direction; and
   a lower portion under the upper portion and having a second width in the first horizontal direction, the second width being less than the first width, and
   the gate insulating layer covers at least a part of a side wall of the lower portion of the landing pad.

7. The semiconductor device of claim 6, wherein both side walls of the lower portion of the landing pad are aligned with both side walls of the first contact.

8. The semiconductor device of claim 6, wherein
   a first side wall of the lower portion of the landing pad is aligned with a first side wall of the first contact, and
   a second side wall of the lower portion of the landing pad protrudes outwards with respect to a second side wall of the first contact.

9. The semiconductor device of claim 1, wherein a top surface of the second contact is on a same plane as a top surface of the second portion of the active semiconductor layer.

10. The semiconductor device of claim 1, wherein
    the first dopant comprises at least one of indium, tin, bismuth, and tungsten, and
    the second dopant includes at least one of indium, tin, bismuth, and tungsten.

11. The semiconductor device of claim 1, wherein the active semiconductor layer comprises at least one of $InGaZnO_x$, $InWO_x$, $InSnGaO_x$, $InAlZnO_x$, $InGaO_x$, or $InSnZnO_x$.

12. A semiconductor device comprising:
    a bit line extending on a substrate in a first horizontal direction;
    a mold insulating layer covering the bit line on the substrate and including a mold opening;
    a first cell transistor on a first side wall of the mold opening; and
    a second cell transistor on a second side wall of the mold opening,
    wherein each of the first cell transistor and the second cell transistor comprises:
    an active semiconductor layer comprising a first portion on the bit line and extending in a vertical direction perpendicular to a top surface of the substrate and a second portion connected to a bottom portion of the first portion and extending in the first horizontal direction, and the active semiconductor layer including an oxide semiconductor material;

a word line on a first side wall of the active semiconductor layer and extending in a second horizontal direction perpendicular to the first horizontal direction;

a gate insulating layer between the active semiconductor layer and the word line;

a first contact on the active semiconductor layer and having a bottom surface at a level lower than a top surface of the word line and the first contact having a top surface at a level higher than the top surface of the word line; and a landing pad on the first contact.

13. The semiconductor device of claim 12, wherein the active semiconductor layer of the first cell transistor and the active semiconductor layer of the second cell transistor are mirror-symmetrical with each other.

14. The semiconductor device of claim 12, wherein each of the first cell transistor and the second cell transistor further comprise a second contact adjacent to the second portion of the active semiconductor layer on the bit line, and the second contact of the first cell transistor is connected to the second contact of the second cell transistor.

15. The semiconductor device of claim 14, wherein the first contact includes an oxide semiconductor containing a first dopant, the second contact includes an oxide semiconductor containing a second dopant, the first dopant includes at least one of indium, tin, bismuth, and tungsten, and the second dopant includes at least one of indium, tin, bismuth, and tungsten.

16. The semiconductor device of claim 12, wherein the gate insulating layer has a top surface at a level higher than the top surface of the first contact and the top surface of the word line, and the gate insulating layer is in contact with a first side wall of the first contact and the first side wall of the active semiconductor layer.

17. The semiconductor device of claim 12, wherein the landing pad comprises:

an upper portion having a first width in the first horizontal direction; and a lower portion under the upper portion and having a second width in the first horizontal direction, the second width being less than the first width, and both side walls of the lower portion of the landing pad are aligned with both side walls of the first contact.

18. The semiconductor device of claim 12, wherein the active semiconductor layer includes at least one of $InGaZnO_x$, $InWO_x$, $InSnGaO_x$, $InAlZnO_x$, $InGaO_x$, or $InSnZnO_x$, the active semiconductor layer has a first oxygen content, the first contact includes at least one of $InGaZnO_y$, $InWO_y$, $InSnGaO_y$, $InAlZnO_y$, $InGaO_y$, or $InSnZnO_y$, and the first contact has a second oxygen content which is less than the first oxygen content.

19. A semiconductor device comprising:

a bit line extending on a substrate in a first horizontal direction;

a mold insulating layer on the bit line and having a mold opening;

an active semiconductor layer on an inner wall of the mold opening, the active semiconductor layer having a first portion extending in a vertical direction perpendicular to a top surface of the substrate and a second portion connected to a bottom portion of the first portion and the active semiconductor layer extending in the first horizontal direction, and including an oxide semiconductor material;

a word line inside the mold opening and on a first side wall of the active semiconductor layer and extending in a second horizontal direction perpendicular to the first horizontal direction;

a gate insulating layer between the active semiconductor layer and the word line;

a first contact on the active semiconductor layer, the first contact having a bottom surface at a level lower than a top surface of the word line and a top surface at a level higher than the top surface of the word line, and the first contact including an oxide semiconductor containing a first dopant;

a second contact adjacent to the second portion of the active semiconductor layer on the bit line and including an oxide semiconductor containing a second dopant;

a landing pad on the first contact; and a capacitor structure on the landing pad.

20. The semiconductor device of claim 19, wherein the first side wall of the active semiconductor layer is aligned with a first side wall of the first contact, a second side wall of the active semiconductor layer opposite to the first side wall thereof is aligned with a second side wall of the first contact opposite to the first side wall thereof, the first side wall of the active semiconductor layer and the first side wall of the first contact are covered by the gate insulating layer, and the second side wall of the active semiconductor layer and the second side wall of the first contact are covered by the mold insulating layer.

* * * * *